(12) United States Patent
Kamata

(10) Patent No.: US 8,637,802 B2
(45) Date of Patent: Jan. 28, 2014

(54) PHOTOSENSOR, SEMICONDUCTOR DEVICE INCLUDING PHOTOSENSOR, AND LIGHT MEASUREMENT METHOD USING PHOTOSENSOR

(75) Inventor: Koichiro Kamata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 158 days.

(21) Appl. No.: 13/154,771

(22) Filed: Jun. 7, 2011

(65) Prior Publication Data

US 2011/0310381 A1 Dec. 22, 2011

(30) Foreign Application Priority Data

Jun. 18, 2010 (JP) ................... 2010-138916

(51) Int. Cl.
*H01L 33/08* (2010.01)
*H01L 31/08* (2006.01)
*H01L 31/113* (2006.01)

(52) U.S. Cl.
USPC ........ 250/214.1; 250/241 R; 257/80; 257/291

(58) Field of Classification Search
USPC ............... 257/40, 401, 443, 72, 80, 291; 250/214 R, 214 A, 214.1, 208.1; 356/218
See application file for complete search history.

(56) References Cited

U.S. PATENT DOCUMENTS 4,236,121 A * 11/1980 Senturia ............................ 331/57
4,639,924 A * 1/1987 Tsunekawa ..................... 372/33
5,461,419 A * 10/1995 Yamada ........................ 348/302
5,731,856 A 3/1998 Kim et al.
5,744,864 A 4/1998 Cillessen et al.
(Continued)

FOREIGN PATENT DOCUMENTS

EP 0 933 673 4/1999
EP 1737044 A 12/2006
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Sang Nguyen
(74) *Attorney, Agent, or Firm* — Eric J. Robinson; Robinson Intellectual Property Law Office, P.C.

(57) ABSTRACT

An object is to provide a photosensor utilizing an oxide semiconductor in which a refreshing operation is unnecessary, a semiconductor device provided with the photosensor, and a light measurement method utilizing the photosensor. It is found that a constant gate current can be obtained by applying a gate voltage in a pulsed manner to a transistor including a channel formed using an oxide semiconductor, and this is applied to a photosensor. Since a refreshing operation of the photosensor is unnecessary, it is possible to measure the illuminance of light with small power consumption through a high-speed and easy measurement procedure. A transistor utilizing an oxide semiconductor having a relatively high mobility, a small S value, and a small off-state current can form a photosensor; therefore, a multifunction semiconductor device can be obtained through a small number of steps.

8 Claims, 21 Drawing Sheets

(56) References Cited

U.S. PATENT DOCUMENTS

| | | | |
|---|---|---|---|
| 5,780,727 A * | 7/1998 | Gimzewski et al. | 73/105 |
| 5,869,978 A * | 2/1999 | Hong | 326/24 |
| 6,198,799 B1 | 3/2001 | Ono et al. | |
| 6,294,274 B1 | 9/2001 | Kawazoe et al. | |
| 6,414,297 B1 * | 7/2002 | Sasaki et al. | 250/214 R |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,253,434 B2 * | 8/2007 | Golovchenko et al. | 257/40 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 * | 7/2008 | Levy et al. | 438/584 |
| 7,411,209 B2 | 8/2008 | Endo et al. | |
| 7,453,065 B2 | 11/2008 | Saito et al. | |
| 7,453,087 B2 * | 11/2008 | Iwasaki | 257/59 |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,573,090 B2 * | 8/2009 | Takano et al. | 257/315 |
| 7,674,650 B2 | 3/2010 | Akimoto et al. | |
| 7,732,819 B2 | 6/2010 | Akimoto et al. | |
| 8,084,331 B2 | 12/2011 | Ofuji et al. | |
| 8,154,480 B2 * | 4/2012 | Shishido et al. | 345/76 |
| 8,194,469 B2 | 6/2012 | Tanaka et al. | |
| 8,530,246 B2 * | 9/2013 | Ofuji et al. | 438/4 |
| 2001/0046027 A1 | 11/2001 | Tai et al. | |
| 2002/0054394 A1 * | 5/2002 | Sasaki et al. | 358/514 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0261253 A1 * | 11/2006 | Arao et al. | 250/214.1 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0033299 A1 * | 2/2009 | Ishino | 323/282 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0002402 A1 * | 1/2010 | Rogers et al. | 361/749 |
| 2010/0065844 A1 | 3/2010 | Tokunaga | |
| 2010/0085081 A1 * | 4/2010 | Ofuji et al. | 326/102 |
| 2010/0092800 A1 | 4/2010 | Itagaki et al. | |
| 2010/0109002 A1 | 5/2010 | Itagaki et al. | |
| 2011/0101942 A1 * | 5/2011 | Yamazaki et al. | 323/282 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-313840 | 11/1994 |
| JP | 08-264794 A | 10/1996 |
| JP | 11-505377 | 5/1999 |
| JP | 11-316428 | 11/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-111125 | 5/2009 |
| JP | 2009-146100 | 7/2009 |
| JP | 2009-182194 | 8/2009 |
| JP | 2009-212443 | 9/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IgZo Transparent Amorphous Oxide Sermiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GiZo (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IgZo Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW'02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D at al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Applications,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

FIG. 11A1
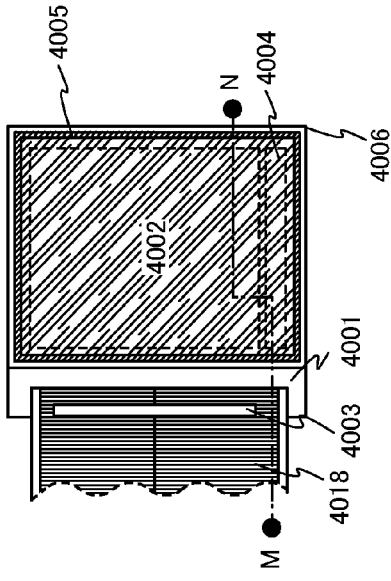
FIG. 11A2
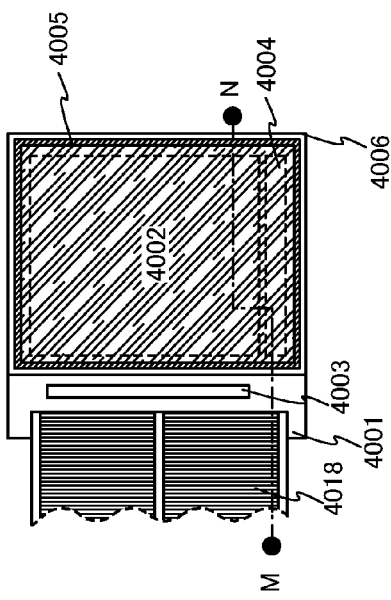
FIG. 11B
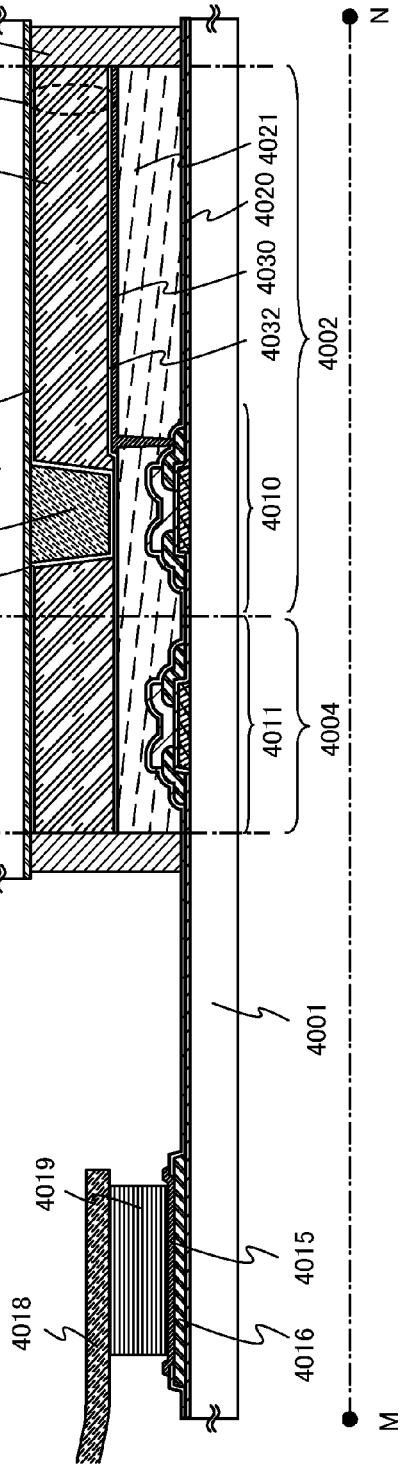

PHOTOSENSOR, SEMICONDUCTOR DEVICE INCLUDING PHOTOSENSOR, AND LIGHT MEASUREMENT METHOD USING PHOTOSENSOR

BACKGROUND OF THE INVENTION

1. Field of the Invention

The present invention relates to a photosensor, and an embodiment of the invention disclosed herein relates to a photosensor utilizing an oxide semiconductor and a semiconductor device including the photosensor. Further, an embodiment of the present invention relates to a light measurement method using the photosensor.

2. Description of the Related Art

A number of detectors used for detecting an electromagnetic wave are known, and for example, detectors having sensitivity to light from the ultraviolet range to the infrared range are collectively referred to as photosensors. Among them, a photosensor having sensitivity to light in a visible light range from a wavelength of 400 nm to a wavelength of 700 nm is particularly referred to as a visible light sensor, and many visible light sensors are used for devices which need luminance adjustment, on/off control, or the like depending on the usage environment.

Some display devices detect ambient brightness of a display portion to adjust the luminance of the display. This is because wasted electric power of the display device can be reduced by increasing visibility through detecting ambient brightness with the use of a photosensor and performing display with an appropriate luminance. For example, as examples of the display device including a photosensor for adjusting the luminance, mobile phones, computers, and the like can be given. Further, as well as the ambient brightness of the display portion, luminance of the backlight of a display device, in particular, a liquid crystal display device is also detected by a photosensor to adjust the luminance of a display screen.

A photosensor, for example, includes a photoelectric conversion element such as a photodiode in a light sensing portion and can detect illuminance based on the amount of current which flows to the photoelectric conversion element. In Patent Document 1, a charge accumulation type photosensor is disclosed. This photosensor measures illuminance by utilizing such a property that the amount of electric charge flowing through a photodiode varies in accordance with the illuminance. More specifically, the illuminance is measured in the following manner: after electric charge is accumulated in a condenser (capacitor), a change in potential caused by discharge of electricity by a constant current circuit (a constant current power supply) is detected by a comparator, the time needed for the change in potential is converted to a digital signal by a counter circuit and a latch circuit, and then the digital signal is output.

As a photosensor, a sensor in which characteristics are changed by light can be utilized. For example, it is well known that conductivity of an oxide semiconductor changes by reception of light, and this fact is described in Patent Document 2 and Patent Document 3. In these documents, a technique for controlling the threshold of a transistor including an oxide semiconductor is disclosed. Further, Patent Document 4 discloses an attempt to use an oxide semiconductor in a photosensor or a memory.

[Reference]
[Patent Document]
[Patent Document 1] Japanese Published Patent Application No. H6-313840
[Patent Document 2] Japanese Published Patent Application No. 2009-111125
[Patent Document 3] Japanese Published Patent Application No. 2009-212443
[Patent Document 4] Japanese Published Patent Application No. 2009-182194

SUMMARY OF THE INVENTION

Oxide semiconductors have advantages in having a higher mobility than amorphous silicon and, in addition, being able to be entirely formed over a several-meter-square substrate called "G10" as a uniform film. These advantages enable a large-sized flat panel display capable of high speed operation to be realized, for example. If a photosensor including an oxide semiconductor can be manufactured, the photosensor and a transistor can be manufactured using the same oxide semiconductor layer, enabling a semiconductor device including a photosensor, for example, a large-sized multi-function flat panel display to be manufactured in a small number of steps. Although the photosensor including an oxide semiconductor is disclosed in Patent Document 4, in this photosensor, characteristics changed by reception of light do not return to an original state unless any operation is performed, and a refreshing operation needs to be performed for every measurement. It is preferable for a photosensor to measure illuminance on a several second cycle; however, if the refreshing operation is performed on a several second cycle, significant power is consumed, which is not preferable. Therefore, an object of an embodiment of the present invention is to provide a method for measuring light with the use of a transistor which includes a channel including an oxide semiconductor, in which a refreshing operation is unnecessary. Further, another object of an embodiment of the present invention is to provide a photosensor having such a feature and a semiconductor device provided with the photosensor.

An embodiment of the present invention is a light measurement method including the steps of applying a negative gate voltage to a transistor which includes a channel including an oxide semiconductor in a pulsed manner, and measuring an illuminance of light received by the channel from an obtained gate current.

The applied gate voltage is preferably higher than or equal to $-10$ V and lower than or equal to $-2$ V. At this time, the voltage applied to a source electrode and a drain electrode of the transistor is set to 0, that is, grounded.

A similar effect can be obtained when the gate voltage is set to 0, that is, grounded and a voltage of higher than or equal to 2 V and lower than or equal to 10 V is applied to the source electrode and the drain electrode of the transistor.

The gate voltage is applied for a period of more than or equal to 0.01 ms and less than or equal to 100 ms, preferably more than or equal to 1 ms and less than or equal to 2 ms. In the case where the application time is more than 100 ms, gate current is significantly changed in that period and the measurement accuracy is lowered. In the case where the application time is less than 0.01 ms, a high-performance circuit is needed, which is not preferable. Thus, an application time of more than or equal to 1 ms and less than or equal to 2 ms is preferable in terms of high measurement accuracy.

The number of applications of the gate voltage per unit time is preferably more than or equal to 30 times per minute and less than or equal to 60 times per minute. With this number of applications, light can be measured with such a frequency as to enable adjustment of a luminance or the like so that a person can perceive light as being continuous under a normal environment. However, the number of applications is not limited to this range and may be selected as appropriate by a practitioner in accordance with the usage. The number of applications can also be called a frequency if the applications are constant; however, it is not always necessary to apply a voltage periodically.

Another embodiment of the present invention is a photosensor which includes a transistor including a channel including an oxide semiconductor and an oscillator circuit, in which an output of the oscillator circuit is electrically connected to a gate electrode of the transistor and the channel is a light receiving portion.

Another embodiment of the present invention is a photosensor which includes a transistor including a channel including an oxide semiconductor and an oscillator circuit, in which an output of the oscillator circuit is electrically connected to a source electrode and a drain electrode of the transistor and the channel is a light receiving portion.

Another embodiment of the present invention is a semiconductor device including the above-described photosensor and an RFID device that operates using a transistor including a channel including the same material as the channel of the transistor included in the photosensor.

Another embodiment of the present invention is a semiconductor device including the above-described photosensor and a display device that operates using a transistor including a channel including the same material as the channel of the transistor included in the photosensor.

Another embodiment of the present invention is a semiconductor device including the above-described photosensor and electronic paper that operates using a transistor including a channel including the same material as the channel of the transistor included in the photosensor.

Note that in this specification, an oscillator circuit refers to the one that applies a voltage as a gate voltage in a pulsed manner; a ring oscillator may be used for example. Further, a divider circuit may also be added in order to control the application time and the like. Further in this specification, "electrical connection" also includes wireless connection.

A transistor utilizing an oxide semiconductor having a relatively high mobility, a small S value, and a small off-state current can form a photosensor according to an embodiment of the present invention; therefore, a multifunction semiconductor device can be obtained through a small number of steps. As examples of such a semiconductor device, there are flat panel displays that are capable of double-frame rate driving or quadruple-frame rate driving utilizing a high mobility and provided with a photosensor, RFID (radio frequency identification) devices provided with a photosensor, and the like. Since the refreshing operation of the photosensor is unnecessary in the case where the voltage is applied in a pulsed manner, it is possible to measure the illuminance of light with small power consumption through a high-speed and easy measurement procedure.

BRIEF DESCRIPTION OF THE DRAWINGS

In the accompanying drawings:

FIGS. 11A1, 11A2, and 11B illustrate semiconductor devices;

DETAILED DESCRIPTION OF THE INVENTION

Figure 1A:
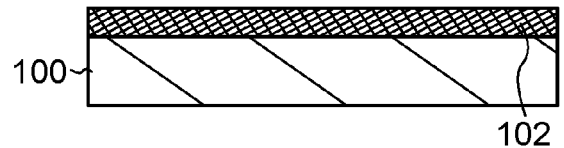
FIGS. 1A to 1E illustrate an example of a manufacturing process of a photosensor according to an embodiment of the present invention.

Hereinafter, embodiments are described in detail using the drawings. Note that the present invention is not limited to the description of the embodiments, and it is apparent to those skilled in the art that modes and details can be modified in various ways without departing from the spirit of the present invention disclosed in this specification and the like. Structures of different embodiments can be implemented in combination as appropriate. Note that in the structure of the invention described below, identical components or components having similar functions are denoted by the same reference numerals, and the description thereof is not repeated. In addition, the semiconductor device in this specification indicates all devices that operate by utilizing semiconductor characteristics.

(Embodiment 1)

In this embodiment, an example of a manufacturing method of a photosensor utilizing a transistor having a bottom-gate structure including an oxide semiconductor and an example of a method for measuring illuminance with the use of the photosensor will be described with reference to drawings. Alternatively, the transistor may have a top-gate structure. The photosensor is one kind of semiconductor elements.

First, a conductive layer 102 is formed over a substrate 100 (see FIG. 1A).

Any substrate having an insulating surface can be used as the substrate 100 and, for example, a glass substrate can be used. Further, it is preferable that the glass substrate be a non-alkali glass substrate. As a material of the non-alkali glass substrate, a glass material such as aluminosilicate glass, aluminoborosilicate glass, barium borosilicate glass, or the like is used, for example. Besides, as the substrate 100, an insulating substrate formed of an insulator such as a ceramic substrate, a quartz substrate, or a sapphire substrate; a semiconductor substrate formed of a semiconductor material such as silicon, whose surface is covered with an insulating material; a conductive substrate formed of a conductive material such as metal or stainless steel, whose surface is covered with an insulating material can be used. In addition, a plastic substrate can be used as long as it can withstand heat treatment in a manufacturing process.

The conductive layer 102 is preferably formed using a conductive material such as aluminum (Al), copper (Cu), molybdenum (Mo), tungsten (W), or titanium (Ti). As a formation method, a sputtering method, a vacuum evaporation method, a plasma CVD method, and the like are given. In the case of using aluminum (or copper) for the conductive layer 102, since aluminum itself (or copper itself) has disadvantages such as low heat resistance and a tendency to be corroded, it is preferably deposited in combination with a conductive material having heat resistance.

As the conductive material having heat resistance, it is possible to use a metal containing an element selected from titanium (Ti), tantalum (Ta), tungsten (W), molybdenum (Mo), chromium (Cr), neodymium (Nd), and scandium (Sc), an alloy containing any of these elements as a component, an alloy containing a combination of any of these elements, a nitride containing any of these elements as a component, or the like. The conductive layer 102 may be formed by stacking the conductive material having heat resistance and aluminum (or copper).

Although not shown, the substrate 100 may be provided with a base layer. The base layer has a function of preventing diffusion of an impurity from the substrate 100, such as an alkali metal (Li, Cs, Na, or the like), an alkaline earth metal (Ca, Mg, or the like), or the like. In other words, provision of the base layer can realize improvement in the reliability of the semiconductor device. The base layer may be formed to have a single-layer structure or a stacked structure using a variety of insulating materials such as silicon nitride or silicon oxide. Specifically, for example, a structure in which silicon nitride and silicon oxide are stacked in that order over the substrate 100 is favorable. This is because silicon nitride has a high blocking effect against an impurity. At the same time, in the case where silicon nitride is in contact with a semiconductor, there is a possibility that a problem occurs in the semiconductor element; thus, silicon oxide is preferably applied as a material in contact with the semiconductor.

Figure 1B:
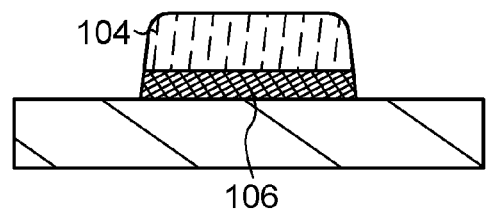

Next, a resist mask 104 is selectively formed over the conductive layer 102 and the conductive layer 102 is selectively etched using the resist mask 104, whereby a conductive layer 106 which functions as a gate electrode is formed (see FIG. 1B).

The resist mask 104 is formed through steps such as application of a resist material, exposure to light using a photomask, and development. For the application of the resist material, a method such as a spin coating method can be employed. Alternatively, the resist mask 104 may be selectively formed by a droplet discharge method, a screen printing method, or the like. In this case, the steps of exposure to light using a photomask, development, and the like are not needed; therefore, improvement in productivity can be achieved. Note that the resist mask 104 is removed after the conductive layer 106 is formed by etching the conductive layer 102.

For the above etching, dry etching or wet etching may be used. In order to improve coverage with a gate insulating layer or the like which is formed later and prevent disconnection of such a layer, the etching is preferably performed so that end portions of the conductive layer 106 are tapered. For example, the end portions are preferably tapered to have a taper angle of more than or equal to 20° and less than 90°.

Here, the "taper angle" refers to an acute angle formed by a side surface of a layer having a tapered shape and a bottom surface of the layer when a cross section of the layer is observed.

Figure 1C:
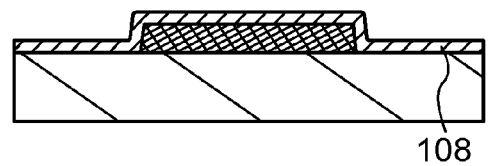

Next, an insulating layer 108 which functions as a gate insulating layer is formed so as to cover the conductive layer 106 (see FIG. 1C). The insulating layer 108 is formed using a material such as silicon oxide, silicon oxynitride, silicon nitride, silicon nitride oxide, aluminum oxide, or tantalum oxide, for example. Alternatively, the insulating layer 108 may be formed of stacked layers of these materials. The thickness of the insulating layer 108 is preferably greater than or equal to 5 nm and less than or equal to 250 nm. For example, silicon oxide with a thickness of 100 nm is formed by a sputtering method. An insulating layer formed by a sputtering method contains a small amount of hydrogen and nitrogen and is preferable as a gate insulating layer. Although the effect of hydrogen, nitrogen, or the like in the film needs to be taken into consideration in the case where the insulating layer 108 is formed using another method (such as a plasma CVD method), the method for forming the insulating layer 108 is not particularly limited as long as the desired insulating layer 108 can be obtained. For example, the insulating layer 108 is formed so as to include hydrogen or nitrogen at a concentration lower than that in an oxide semiconductor layer to be formed later. More specifically, it is preferable that the hydrogen concentration in the insulating layer 108 be $1 \times 10^{21}$ atoms/cm$^3$ or lower (further preferably $5 \times 10^{20}$ atoms/cm$^3$ or lower); the nitrogen concentration in the insulating layer 108 be $1 \times 10^{19}$ atoms/cm$^3$ or lower. Note that in order to obtain the insulating layer 108 having favorable characteristics, the temperature of the film formation is preferably 400° C. or lower; however, an embodiment of the invention disclosed herein is not limited to this. Further, the above-described concentrations mean average values in the insulating layer 108.

Alternatively, the insulating layer 108 having a stacked structure may be formed using a combination of a sputtering method and a CVD method (a plasma CVD method or the like). For example, a lower layer of the insulating layer 108 (a region in contact with the conductive layer 106) can be formed by a plasma CVD method and an upper layer of the insulating layer 108 can be formed by a sputtering method. A plasma CVD method enables a film with favorable step coverage to be formed with ease; therefore, it is suitable for a method for forming a film just above the conductive layer 106 having a large step. A sputtering method can easily reduce the hydrogen concentration of a formed film; therefore, it is suitable for a method for forming a film in contact with an oxide semiconductor layer that is easily adversely affected by hydrogen. Thus, diffusion of hydrogen in the insulating layer 108 to the oxide semiconductor layer can be suppressed. Hydrogen existing in the oxide semiconductor layer or in a vicinity thereof has a significantly large influence on semiconductor characteristics, and this way of forming the insulating layer 108 is effective.

In this specification, an oxynitride refers to a substance in which the amount in atomic percent of oxygen is larger than that of nitrogen, and a nitride oxide refers to a substance in which the amount in atomic percent of nitrogen is larger than that of oxygen.

Figure 1D:
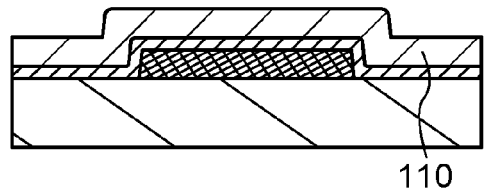

Next, an oxide semiconductor layer 110 is formed to cover the insulating layer 108 (see FIG. 1D). In this embodiment, the oxide semiconductor layer 110 includes a metal oxide semiconductor material.

The oxide semiconductor layer includes at least one element selected from In, Ga, Sn, and Zn. For example, an oxide of four metal elements, such as an In—Sn—Ga—Zn—O- based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or an oxide of one metal element, such as an In—O-based oxide semiconductor, a Sn—O-based oxide semiconductor, or a Zn—O-based oxide semiconductor can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

For the oxide semiconductor layer, a thin film expressed by a chemical formula $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used for the oxide semiconductor, a target with the following composition ratio is used: the composition ratio of In:Zn is 50:1 to 1:2 in an atomic ratio ($In_2O_3$:ZnO=25:1 to 1:4 in a molar ratio), preferably 20:1 to 1:1 in an atomic ratio ($In_2O_3$:ZnO=10:1 to 1:2 in a molar ratio), further preferably 15:1 to 1.5:1 in an atomic ratio ($In_2O_3$:ZnO=15:2 to 3:4 in a molar ratio). For example, a target used for the formation of an In—Zn—O-based oxide semiconductor has the following atomic ratio: In:Zn:O is X:Y:Z, where Z>1.5X+Y.

The oxide semiconductor layer 110 can be formed by a sputtering method using an oxide semiconductor target including In, Ga, and Zn ($In_2O_3$:$Ga_2O_3$:ZnO=1:1:1). The sputtering can be performed under the following conditions, for example: the distance between the substrate 100 and the target is more than or equal to 30 mm and less than or equal to 500 mm; the pressure is higher than or equal to 0.1 Pa and lower than or equal to 2.0 Pa; direct current (DC) power supply is higher than or equal to 0.25 kW and lower than or equal to 5.0 kW; the temperature is higher than or equal to 20° C. and lower than or equal to 100° C.; the atmosphere is a rare gas atmosphere of argon or the like, an oxygen atmosphere, or a mixed atmosphere of a rare gas such as argon and oxygen. As the above sputtering method, an RF sputtering method in which a high frequency power supply is used as a power supply for sputtering, a DC sputtering method in which a DC power supply is used, a pulsed DC sputtering method in which a DC bias is applied in a pulsed manner, or the like can be employed.

In this embodiment, the case where the oxide semiconductor layer 110 is formed to have a single-layer structure is described; however, the oxide semiconductor layer 110 may have a stacked structure. For example, instead of the above structure, an oxide semiconductor layer having a composition similar to that of the oxide semiconductor layer 110 (hereinafter called an "oxide semiconductor layer with normal conductivity") can be formed over the insulating layer 108, and after that, an oxide semiconductor layer whose constituent elements are similar to those of the oxide semiconductor layer 110 and whose composition ratio is different from that of the oxide semiconductor layer 110 (hereinafter called an "oxide semiconductor layer with high conductivity") can be formed. In this case, the oxide semiconductor layer with high conductivity is positioned between a source electrode (or a drain electrode) and the oxide semiconductor layer with normal conductivity, which can improve element characteristics.

The ratio of the flow rate of an oxygen gas to the flow rate of an argon gas in film formation conditions of the oxide semiconductor layer with high conductivity be smaller than that in film formation conditions of the oxide semiconductor layer with normal conductivity. More specifically, the oxide semiconductor layer with high conductivity is formed in a rare gas (such as argon or helium) atmosphere or an atmosphere containing an oxygen gas at 10% or less and a rare gas at 90% or more. The oxide semiconductor layer with normal conductivity is formed in an oxygen atmosphere or an atmosphere in which the flow rate of an oxygen gas is 1 time or more that of a rare gas. In such a manner, two kinds of oxide semiconductor layers having different conductivities can be formed.

In the case where the oxide semiconductor layer 110 is formed without exposure to the air after formation of the insulating layer 108, particles or moisture can be prevented from attaching to an interface between the insulating layer 108 and the oxide semiconductor layer 110.

Note that the oxide semiconductor layer 110 may have a thickness of approximately 5 nm to 200 nm.

Figure 1E:
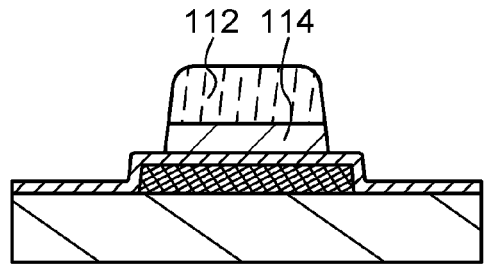

Next, a resist mask 112 is selectively formed over the oxide semiconductor layer 110 and the oxide semiconductor layer 110 is selectively etched using the resist mask 112, whereby an oxide semiconductor layer 114 is formed (see FIG. 1E). Here, the resist mask 112 can be formed in a manner similar to that of the resist mask 104. Note that the resist mask 112 is removed after the oxide semiconductor layer 114 is formed by etching the oxide semiconductor layer 110.

Either wet etching or dry etching can be employed as the etching of the oxide semiconductor layer 110. Here, an unnecessary portion of the oxide semiconductor layer 110 is removed by wet etching using a mixed solution of acetic acid, nitric acid, and phosphoric acid, so that the oxide semiconductor layer 114 is formed. Note that the etchant (the etching solution) used in the above wet etching may be any solution which can etch the oxide semiconductor layer 110, and is not limited to the above-described solution.

In the case of employing dry etching, a gas containing a chlorine atom (e.g., chlorine ($Cl_2$), chlorine dioxide ($ClO_2$)) or a gas containing a chlorine atom to which oxygen ($O_2$) is added may be used. By using a gas including a chlorine atom, etching selectivity of the oxide semiconductor layer 110 with respect to the insulating layer can be easily obtained.

As an etching apparatus used for the dry etching, an etching apparatus using a reactive ion etching method (an RIE method), or a dry etching apparatus using a high-density plasma source such as an ECR (electron cyclotron resonance) source or an ICP (inductively coupled plasma) source can be used. Alternatively, a technique similar to the above technique may be employed.

Figure 2A:
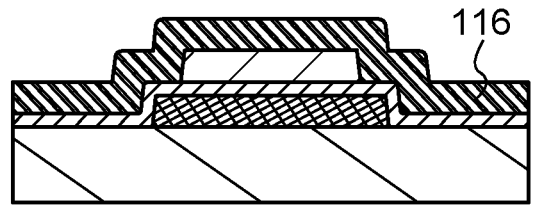
FIGS. 2A to 2D illustrate an example of a manufacturing process of a photosensor according to an embodiment of the present invention.

Next, a conductive layer 116 is formed so as to cover the insulating layer 108 and the oxide semiconductor layer 114 (see FIG. 2A). The conductive layer 116 can be formed using a material and a method similar to those of the conductive layer 102. For example, the conductive layer 116 can be formed with a single-layer structure of molybdenum or titanium. Alternatively, the conductive layer 116 may be formed with a stacked structure and, for example, a stacked structure of aluminum and titanium can be employed. Further, the conductive layer 116 may have a three-layer structure in which titanium, aluminum, and titanium are stacked in this order. Alternatively, a three-layer structure in which molybdenum, aluminum, and molybdenum are stacked in this order may be used. As the aluminum used for these stacked structures, an aluminum film including neodymium (Al—Nd) may be used. Further alternatively, the conductive layer 116 may have a single-layer structure of an aluminum film containing silicon.

Figure 2B:
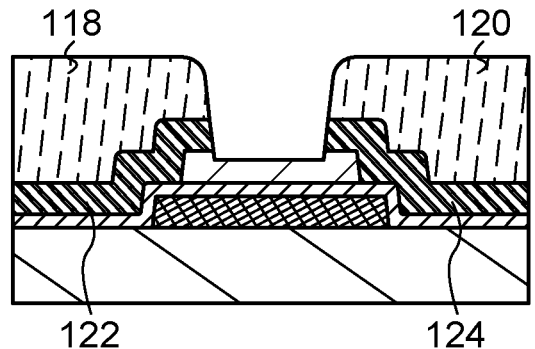

Next, a resist mask 118 and a resist mask 120 are selectively formed over the conductive layer 116 and the conductive layer 116 is selectively etched using the resist masks, so that a conductive layer 122 which functions as one of source and drain electrodes and a conductive layer 124 which functions as the other of source and drain electrodes are formed (see FIG. 2B). Here, the resist masks 118 and 120 can be formed in a manner similar to that of the resist mask 104. Note that the resist masks 118 and 120 are removed after the conductive layers 122 and 124 are formed by etching the conductive layer 116.

The resist mask 118 and the resist mask 120 may be formed using a multi-tone mask. Here, the multi-tone mask is a mask capable of light exposure with multi-level light intensity. With the use of a multi-tone mask, a one-time exposure and development process can form a resist mask with plural thicknesses (typically, two kinds of thicknesses). By using the multi-tone mask, the number of steps can be reduced.

Either wet etching or dry etching can be employed as the etching of the conductive layer 116. Here, an unnecessary portion of the conductive layer 116 is removed by dry etching, so that the conductive layer 122 and the conductive layer 124 are formed.

Note that, although a structure (a channel-etch type) in which part of the oxide semiconductor layer 114 is removed when the conductive layer 116 is etched is employed in this embodiment, an embodiment of the invention disclosed herein is not limited to this. Instead, another structure (an etching stopper type) can be employed in which a layer (an etching stopper) which prevents the etching from proceeding is formed between the oxide semiconductor layer 114 and the conductive layer 116 so that the semiconductor layer 114 is not etched.

After the conductive layers 122 and 124 are formed, heat treatment is performed at a temperature higher than or equal to 100° C. and lower than or equal to 500° C., typically higher than or equal to 200° C. and lower than or equal to 400° C. The atmosphere in which the heat treatment is performed can be, for example, an air atmosphere, a nitrogen atmosphere, an oxygen atmosphere, or the like. Further, the heat treatment time can be approximately more than or equal to 0.1 hours and less than or equal to 5 hours. Here, the heat treatment is performed at 350° C. in a nitrogen atmosphere for one hour. Note that the timing of the heat treatment is not particularly limited as long as it is after the oxide semiconductor layer 110 is formed and before an insulating layer serving as an interlayer insulating layer is formed. For example, the heat treatment may be performed just after the oxide semiconductor layer 110 is formed. Alternatively, the heat treatment may be performed just after the oxide semiconductor layer 114 is formed or just after the conductive layer 116 is formed. By performing the heat treatment (the first heat treatment) and the following heat treatment (the second heat treatment), characteristics of the semiconductor element can be improved and variation in the characteristics can be suppressed.

Note that it is preferable that the above-described heat treatment be performed at 400° C. or lower in order not to change (deteriorate) characteristics of the insulating layer 108 which functions as the gate insulating layer. Needless to say, an embodiment of the invention disclosed herein should not be interpreted as being limited thereto.

The positional relation between the oxide semiconductor layer 114 and the conductive layers 122 and 124 is not limited to the one illustrated in FIGS. 2A to 2D and the positions thereof may be inverted. An example of the structure in which the positions are inverted is illustrated in a drawing in a later embodiment of the invention. Further, a structure in which part of an oxide semiconductor layer is sandwiched between conductive layers or a structure in which part of a conductive layer is sandwiched between oxide semiconductor layers may be employed. The same can be said for a transistor having a top-gate structure.

Figure 2C:
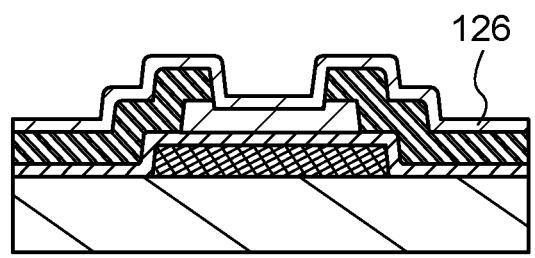

Next, an insulating layer 126 is formed so as to cover the conductive layer 122, the conductive layer 124, the oxide semiconductor layer 114, and the like (see FIG. 2C). Here, the insulating layer 126 serves as a so-called interlayer insulating layer. The insulating layer 126 can be formed using a material such as silicon oxide, aluminum oxide, or tantalum oxide. The insulating layer 126 may also be formed by stacking films of these materials.

The hydrogen concentration in the insulating layer 126 is, for example, lower than or equal to $1 \times 10^{21}$ atoms/cm$^3$ (preferably lower than or equal to $5 \times 10^{20}$ atoms/cm$^3$). Further, the nitrogen concentration in the insulating layer 126 is preferably lower than or equal to $1 \times 10^{19}$ atoms/cm$^3$. Note that the above-described concentrations mean average values in the insulating layer 126.

As a more specific example of the insulating layer 126 fulfilling the above-described conditions, a silicon oxide formed by a sputtering method can be given. This is because, in the case of using a sputtering method, the hydrogen concentration in the film can be easily reduced. Needless to say, any of other methods including a plasma CVD method may be employed as long as the above conditions are fulfilled. For example, after the insulating layer 126 is formed by a plasma CVD method, the hydrogen concentration in the insulating layer 126 can be reduced by subjecting the insulating layer 126 to plasma treatment using a gas including a halogen element. The other conditions of the insulating layer 126 are not particularly limited. For example, the thickness of the insulating layer 126 can vary within a feasible range.

Figure 2D:
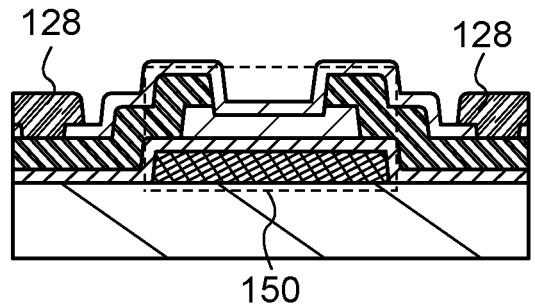

After that, a variety of electrodes and wirings are formed, whereby a semiconductor device provided with the transistor 150 is completed (see FIG. 2D). In this embodiment, a typical example is shown in which a conductive layer 128 connected to the conductive layers 122 and 124 functioning as a source and drain electrodes is formed. However, an embodiment of the invention disclosed herein is not limited to this.

After the conductive layer 128 is formed, heat treatment is performed at a temperature higher than or equal to 100° C. and lower than or equal to 500° C., typically, higher than or equal to 200° C. and lower than or equal to 400° C. The atmosphere in which the heat treatment is performed can be, for example, an air atmosphere, a nitrogen atmosphere, an oxygen atmosphere, or the like. Further, the heat treatment time can be approximately more than or equal to 0.1 hours and less than or equal to 5 hours. Here, the heat treatment is performed at 350° C. in a nitrogen atmosphere for one hour. Note that the timing of the heat treatment is not particularly limited as long as it is after the formation of the insulating layer 126. For example, the above heat treatment may be performed just after the insulating layer 126 is formed. Alternatively, the above heat treatment may be performed after another insulating layer, another conductive layer, or the like is formed. By performing the heat treatment (the second heat treatment) and the preceding heat treatment (the first heat treatment), characteristics of the semiconductor element can be improved and variation in characteristics can be suppressed.

Note that the effect of the second heat treatment is not limited to the above. For example, the second heat treatment also provides an advantageous effect of repairing defects in the insulating layer 126. Since the insulating layer 126 is formed at a relatively low temperature, the film includes defects. Accordingly, the element characteristics might be adversely affected when the insulating layer 126 is used as it is. From a perspective of repairing such defects in the insulating layer 126, it can be said that the above-described heat treatment plays an important role.

In addition, it is preferable that the heat treatment be performed at 400° C. or lower so as not to change (deteriorate) characteristics of the insulating layer 108 which functions as the gate insulating layer. Needless to say, an embodiment of the invention disclosed herein should not be interpreted as being limited thereto.

Next, a method for measuring illuminance of light by utilizing the completed transistor 150 will be described. For example, first, light to be measured enters the oxide semiconductor layer 114 from the upper direction of the transistor 150. In this case, the insulating layer 126 has to be the one that transmits the light to be measured. Alternatively, the substrate 100, the conductive layer 106, and the insulating layer 108 may be formed to have a light-transmitting property to light to be measured so that the light to be measured enters the oxide semiconductor layer 114.

Then, gate current is measured under a state in which a negative gate voltage is applied in a pulsed manner. In this case, the gate current varies depending on the illuminance of light, and by utilizing this, the illuminance can be measured. A specific example is described with reference to FIGS. 3A and 3B.

Figure 3A:
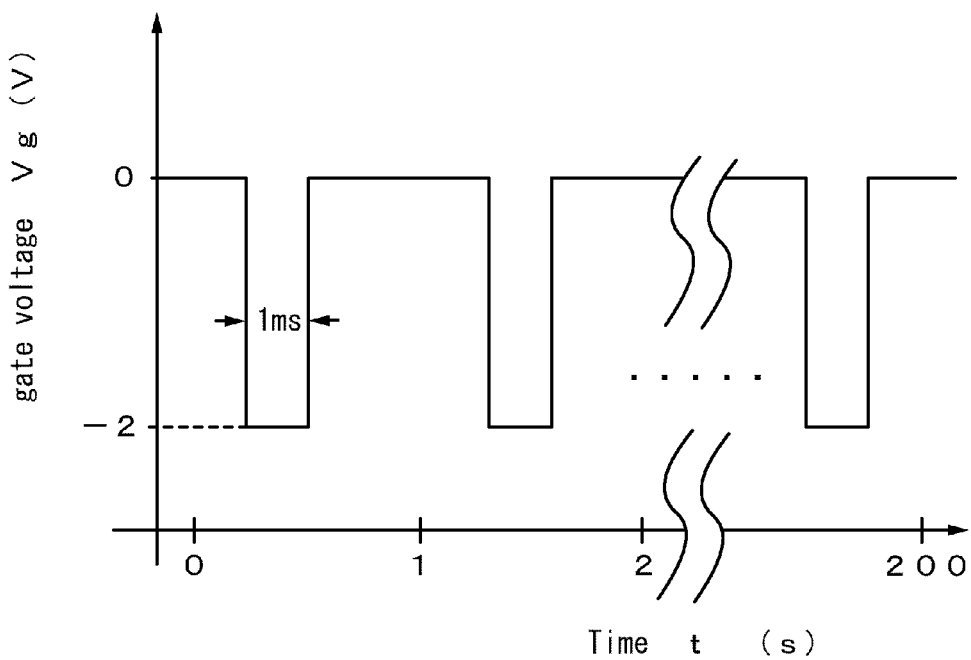
FIGS. 3A and 3B illustrate a relation between a gate current and a gate voltage.
Figure 3B:
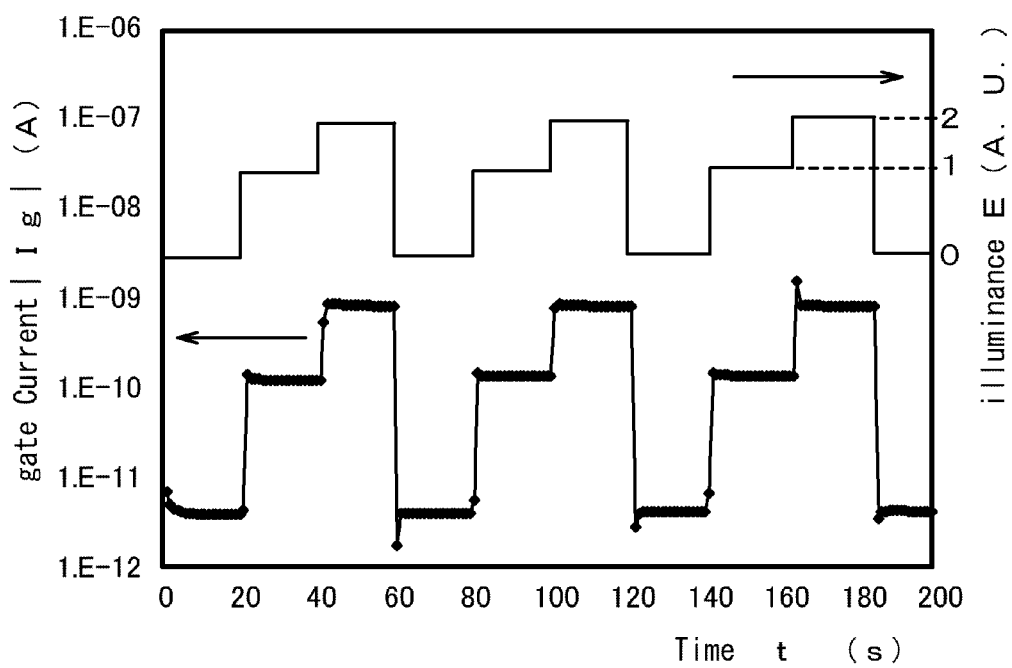

FIG. 3A shows an example of a relation between the applied gate voltage and the time. The vertical axis indicates the gate voltage Vg, and the horizontal axis indicates the time t. In this example, the gate voltage was −2V, the time for applying one pulse was 1 ms, and the pulse frequency was 60 pulses per minute. The relation among the gate current Ig, the illuminance E of light entering the oxide semiconductor layer 114, and the time t is shown in FIG. 3B. The left vertical axis indicates the absolute value of the gate current Ig, the right vertical axis indicates the illuminance E of light, and the horizontal axis indicate the time t. When the illuminance of light to which the transistor 150 was exposed is changed every 20 seconds, it was found that the gate current Ig obtained was constant corresponding to the illuminance. According to this experiment, at an illuminance of 0, the absolute value of the gate current Ig was $4 \times 10^{-12}$ A (amperes); at an illuminance of 1, the absolute value of the gate current Ig was $1 \times 10^{-10}$ A (amperes); and at an illuminance of 2, the absolute value of the gate current Ig was $8 \times 10^{-10}$ A (amperes). Note that the illuminance of 0 means a state in which the transistor 150 is irradiated with no light, the illuminance of 1 means a state in which the transistor 150 is irradiated with light having an illuminance that is not the illuminance of 0, and the illuminance of 2 means a state in which the transistor 150 is irradiated with light having an illuminance higher than the illuminance of 1. Thus, it was found that there is a positive correlation between the illuminance E and the absolute value of the gate current Ig. Further, the reproducibility is high; therefore, it was found that the transistor 150 can be used as a photosensor. Note that for application of a voltage in a pulsed manner, an oscillator circuit such as a ring oscillator may be used, for example. Further, a divider circuit may also be added in order to control the application time.

Next, it will be described why the gate voltage Vg has to be applied in a pulsed manner, along FIGS. 4A and 4B and FIGS. 5A and 5B.

Figure 4A:
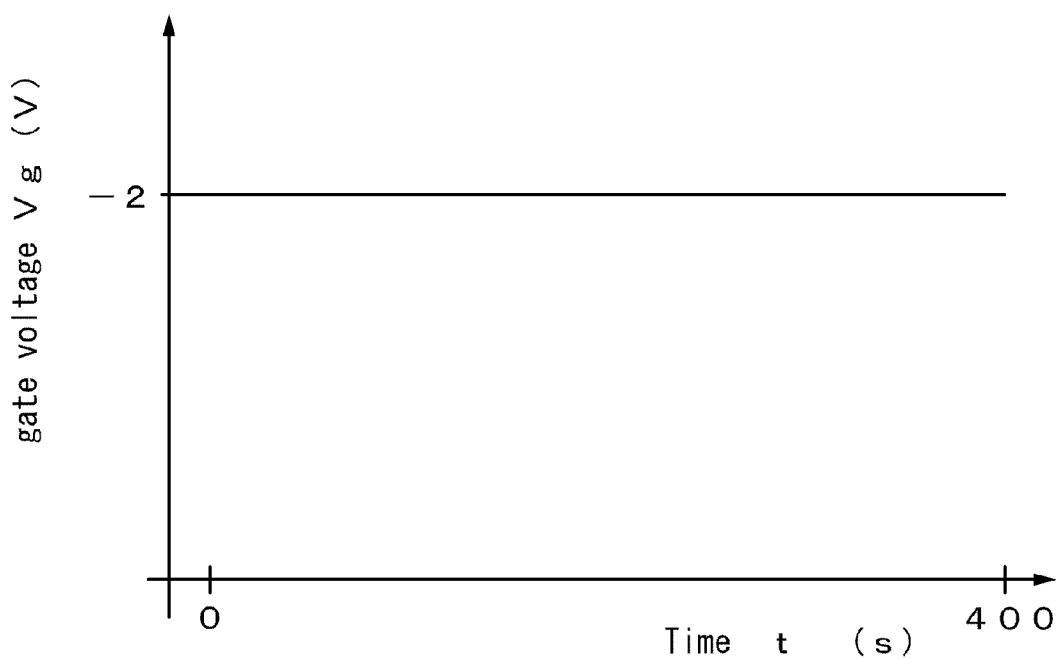
FIGS. 4A and 4B illustrate a relation between a gate current and a gate voltage.
Figure 4B:
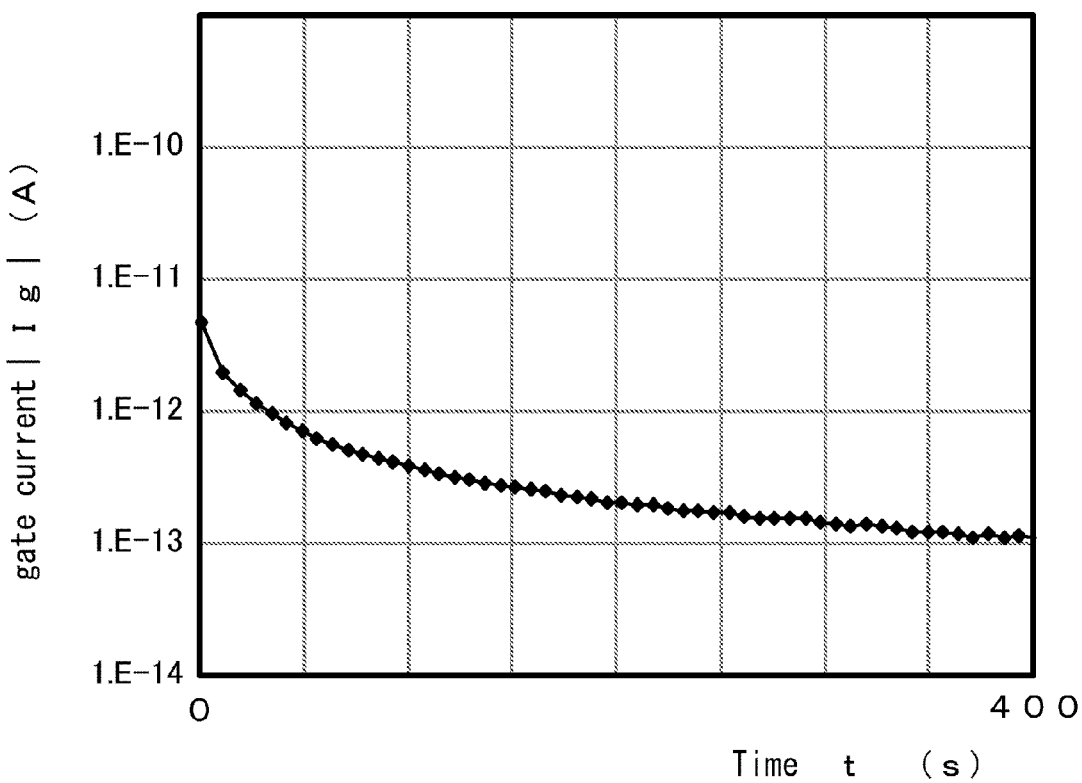

FIGS. 4A and 4B show an example in which a constant gate voltage Vg (in this example, Vg is −2 V) keeps being applied to the transistor 150 which is not exposed to light, for 400 seconds. FIG. 4A shows a relation between the applied gate voltage Vg and the time t. At this time, the gate current Ig changes over time as shown in FIG. 4B. The vertical axis indicates the absolute value of the gate current Ig, and the horizontal axis indicates the time t. In the graph, the absolute value of the gate current Ig gradually decreases over the period of 400 seconds. Since the gate current Ig changes over time when the constant gate voltage Vg is applied, it is difficult to measure the illuminance from the gate current value.

Figure 5A:
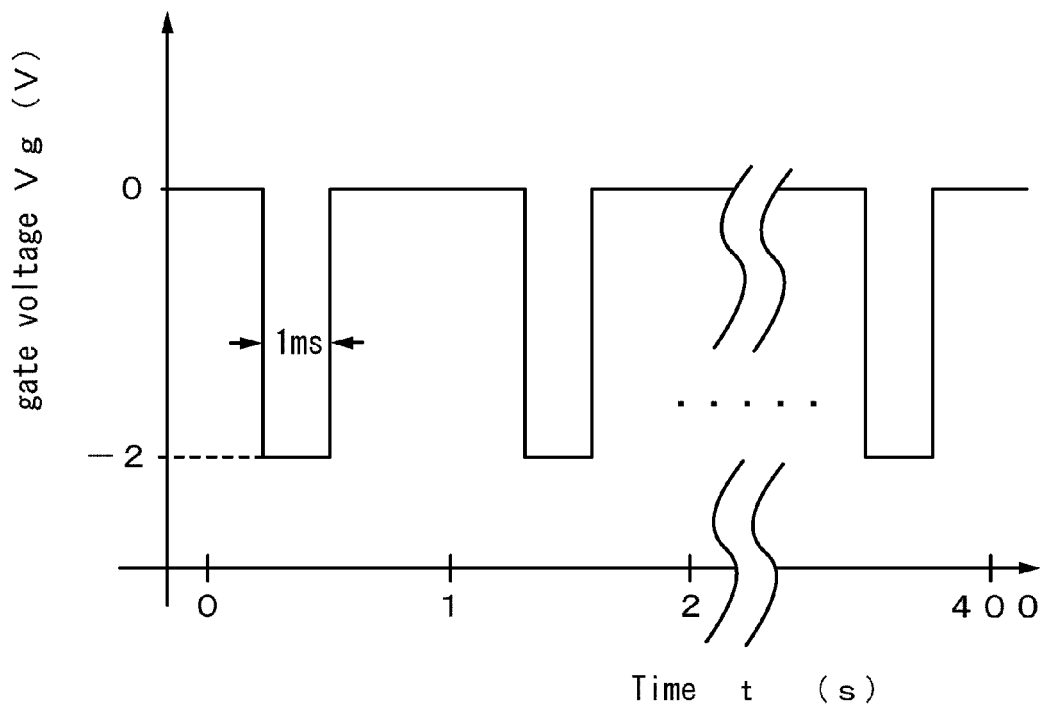
FIGS. 5A and 5B illustrate a relation between a gate current and a gate voltage.
Figure 5B:
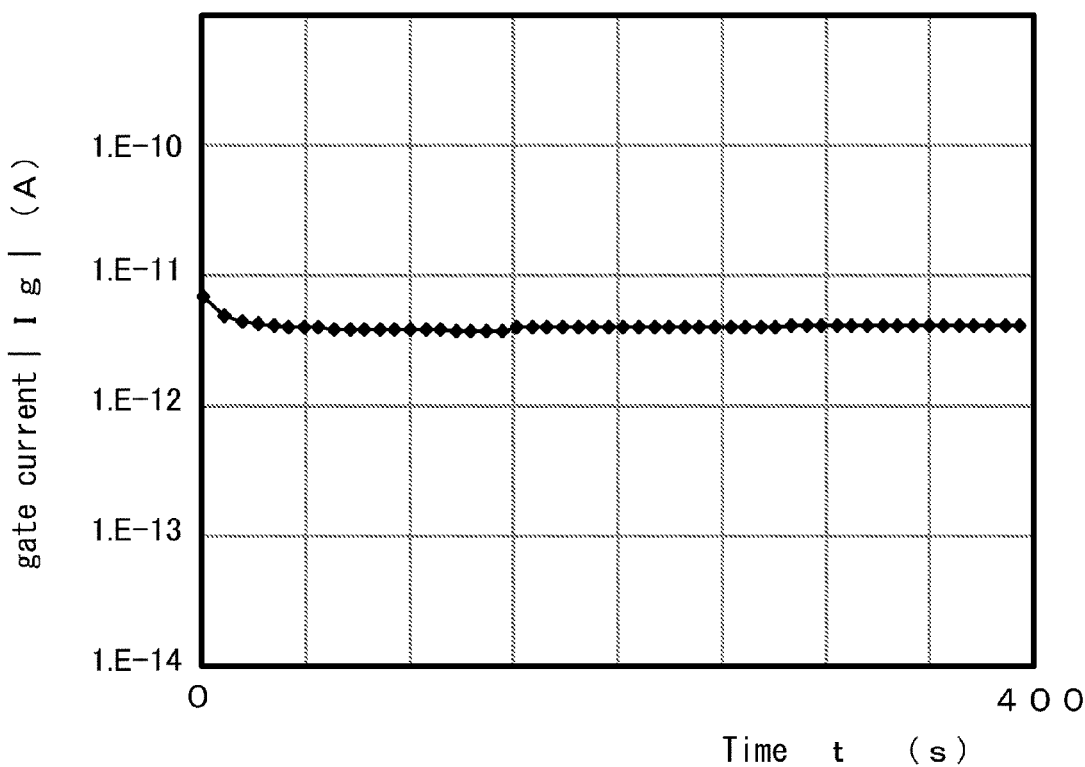

On the other hand, FIGS. 5A and 5B show an example in which a gate voltage Vg (in this example, Vg is −2 V) keeps being applied to the transistor 150 which is not exposed to light in a pulsed manner, that is, intermittently for 400 seconds. FIG. 5A shows a relation between the applied gate voltage Vg and the time t. The time for applying one pulse of gate voltage was 1 ms, and the pulse frequency was 8 pulses per minute. At this time, the gate current Ig was almost constant as shown in FIG. 5B. The vertical axis indicates the absolute value of the gate current Ig, and the horizontal axis indicates the time t. The illuminance of light can be derived from the measured gate current Ig.

As described in this embodiment, the illuminance of light can be measured using the transistor including the oxide semiconductor layer 114. A transistor utilizing an oxide semiconductor having a relatively high mobility, a small S value, and a small off-state current can form a photosensor according to an embodiment of the present invention; therefore, a multifunction semiconductor device can be obtained through a small number of steps. As examples of such a semiconductor device, there are flat panel displays that are capable of double-frame rate driving or quadruple-frame rate driving utilizing a high mobility and provided with a photosensor, RFID (radio frequency identification) devices provided with a photosensor, and the like. Since the refreshing operation of the photosensor is unnecessary in the case where the voltage is applied in a pulsed manner, it is possible to measure the illuminance of light with small power consumption through a high-speed and easy procedure.

This embodiment can be implemented in combination with any of the other embodiments, as appropriate.

(Embodiment 2)

In this embodiment, an example of connecting a current amplifier to a photosensor according to an embodiment of the present invention will be described. Since the current detected by the photosensor is extremely weak, this structure is preferable. Note that a photosensor provided with a current amplifier may be collectively referred to as a photosensor; however, a photosensor and a current amplifier are individually named in this specification.

Figure 6A:
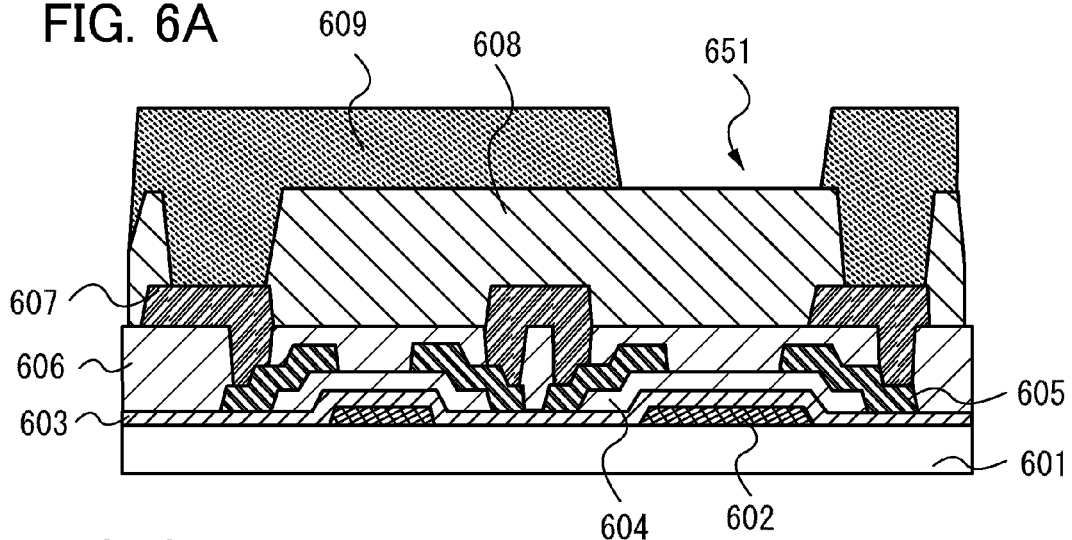
FIGS. 6A to 6C are cross-sectional views each illustrating a photosensor according to an embodiment of the present invention.
Figure 6B:
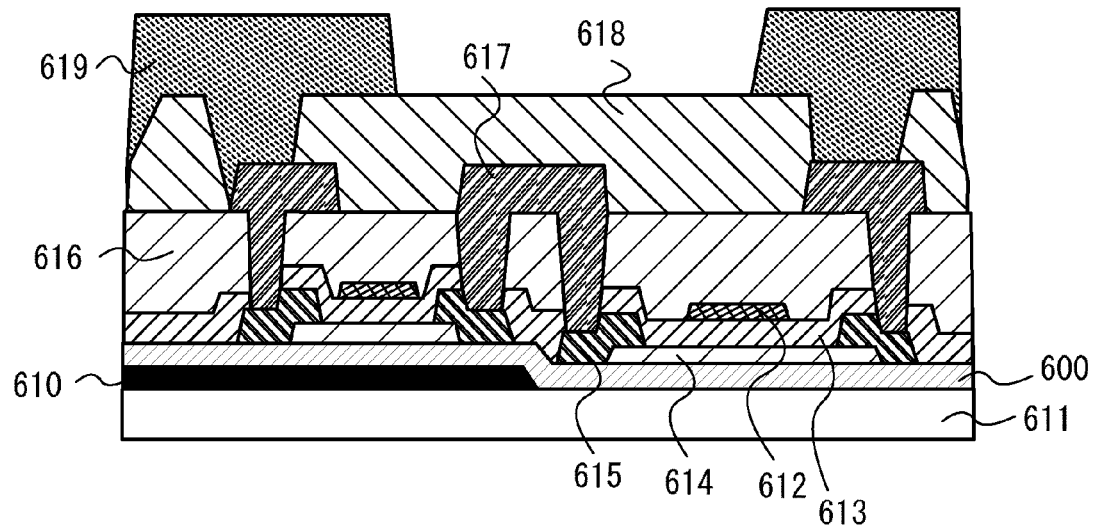
Figure 6C:
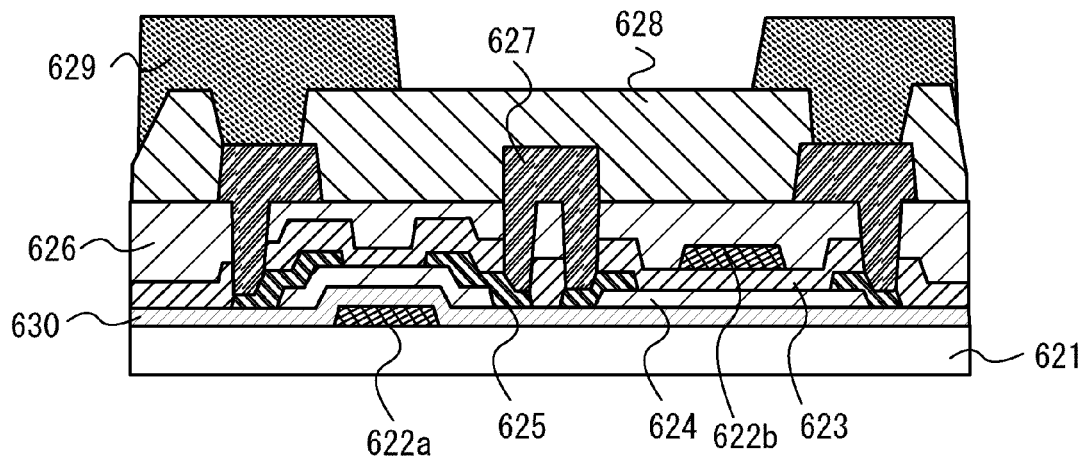

FIGS. 6A to 6C illustrate an example in which a photosensor and a current amplifier are both provided. Although a transistor including an oxide semiconductor can be used for the current amplifier, in such a case, a light-blocking portion is preferably provided because characteristics of the transistor vary when the transistor is exposed to light. Further, for a further increase of the current amplitude, a plurality of transistors may be provided in the current amplifier.

FIG. 6A illustrates an example in which two bottom-gate oxide semiconductor transistors are provided. In the drawing, the left transistor is a current amplifier, and the right transistor is a photosensor.

Next, components of each transistor are described. In the example of FIG. 6A, the transistor of the current amplifier and the transistor of the photosensor have completely the same structure, and description will therefore be made on only one of the two transistors here. A conductive layer 602 functioning as a gate electrode is formed over a substrate 601, and an insulating layer 603 functioning as a gate insulating layer is formed over the conductive layer 602. An insulating layer serving as a base layer may be provided between the substrate 601 and the conductive layer 602. Further, an oxide semiconductor layer 604 is provided over the insulating layer 603, and a conductive layer 605 functioning as a source electrode or a drain electrode is provided over the oxide semiconductor layer 604. An insulating layer 606 covers the oxide semiconductor layer 604, the conductive layer 605, and the like, and an opening portion reaching the conductive layer 605 is provided in the insulating layer 606. A conductive layer 607 functioning as a wiring fills the opening portion and electrically connects the transistors. An insulating layer 608 covers the conductive layer 607 and protects the conductive layer 607 from the outside, and an opening portion reaching part of the conductive layer 607 is provided in the insulating layer 608. A conductive layer 609 fills the opening portion and forms a wiring portion that is connected to a power supply line VDD or a power supply line VSS provided outside. An opening portion 651 is provided in the conductive layer 609 in a region above the transistor serving as a photosensor. Light enters through the opening portion 651, and the illuminance of the light can be measured. In addition, the conductive layer 609 also has a role of shielding the transistor of the current amplifier from light.

FIG. 6B illustrates an example in which two top-gate oxide semiconductor transistors are provided. In the drawing, the left transistor is a current amplifier, and the right transistor is a photosensor.

Next, components of each transistor are described. In the example of FIG. 6B, the transistor of the current amplifier and the transistor of the photosensor have completely the same structure, and description will therefore be made on only one of the two transistors here. A light-blocking layer 610 is provided over part of a substrate 611 and shields the transistor of the current amplifier from light. An insulating layer 600 functioning as a base layer is provided between the substrate 611 and the light-blocking layer 610. In this manner, entry of impurities from the substrate 611 to the transistor can be prevented. An oxide semiconductor layer 614 is provided over the insulating layer 600, and a conductive layer 615 functioning as a source electrode or a drain electrode is provided over the oxide semiconductor layer 614. An insulating layer 613 covering the conductive layer 615 and the oxide semiconductor layer 614 functions as a gate insulating layer. Further, a conductive layer 612 functioning as a gate electrode is provided over the insulating layer 613, and an insulating layer 616 covers the conductive layer 612 and the insulating layer 613. An opening portion reaching the conductive layer 615 is provided in the insulating layer 616 and the insulating layer 613. A conductive layer 617 functioning as a wiring fills the opening portion and electrically connects the transistors and the like. An insulating layer 618 covers the conductive layer 617 and protects the conductive layer 617 from the outside. An opening portion reaching part of the conductive layer 617 is provided in the insulating layer 618. A conductive layer 619 fills the opening portion and forms a wiring portion that is connected to a power supply line VDD or a power supply line VSS provided outside. In the top-gate transistor, light enters the oxide semiconductor layer 614 from the substrate 611 side, and the illuminance of the light is measured. Needless to say, depending on the kind of electrodes, light can enter either side of the transistor. In this example, owing to the existence of the light-blocking layer 610, light enters only the transistor on the right side in the drawing.

FIG. 6C illustrates an example in which a top-gate oxide semiconductor transistor and a bottom-gate oxide semiconductor transistor are provided. In the drawing, the left bottom-gate transistor a is a current amplifier and the right top-gate transistor b is a photosensor; however, they may be interchanged.

Next, components of each transistor are described. A conductive layer 622a included in the transistor a and functioning as a gate electrode is provided over a substrate 621. An insulating layer 630 functioning as a gate insulating layer of the transistor a is provided over the conductive layer 622a. The insulating layer 630 also functions as a base layer of the transistor b. Further, an oxide semiconductor layer 624 is provided over the insulating layer 630 and functions as a channel in both of the transistors. A conductive layer 625 functioning as a source electrode or a drain electrode is provided in contact with the oxide semiconductor layer 624. An insulating layer 623 functioning as a gate insulating layer of the transistor b covers the oxide semiconductor layer 624, the conductive layer 625, and the like. A conductive layer 622b functioning as a gate electrode of the transistor b is provided over the insulating layer 623, and an insulating layer 626 is provided so as to cover the conductive layer 622b and the insulating layer 623. An opening portion reaching the conductive layer 625 is provided in the insulating layer 626 and the insulating layer 623. A conductive layer 627 functioning as a wiring fills the opening portion and electrically connects the transistors and the like. An insulating layer 628 covers the conductive layer 627 and protects the conductive layer 627 from the outside. An opening portion reaching part of the conductive layer 627 is provided in the insulating layer 628. A conductive layer 629 fills the opening portion and forms a wiring portion that is connected to a power supply line VDD or a power supply line VSS provided outside. In the top-gate transistor, light enters the oxide semiconductor layer 624 from the substrate 621 side, and the illuminance of the light is measured. At this time, the conductive layer 622a functioning as a gate electrode of the transistor a also functions as a light-blocking layer.

Figure 7:
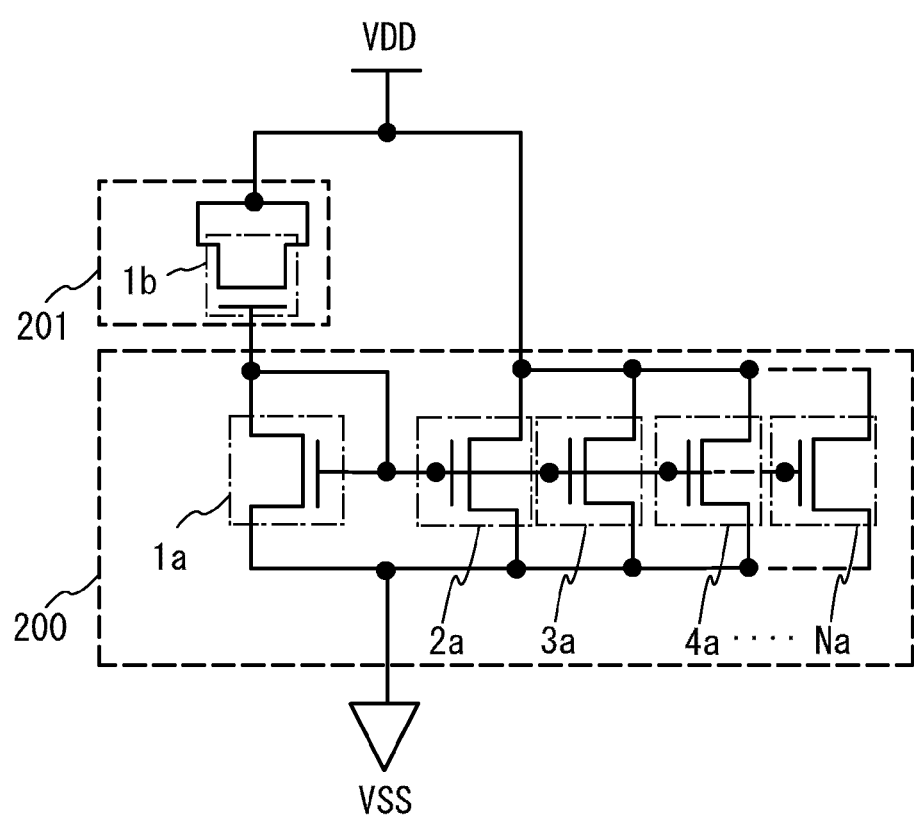
FIG. 7 is a circuit diagram of a photosensor according to an embodiment of the present invention.

Next, a current amplification method will be described with reference to the circuit diagram of FIG. 7. A photosensor 201 includes one transistor 1b. This transistor 1b is connected to a current amplifier 200 including N number of transistors ka (k is a natural number greater than or equal to 1 and less than or equal to N), and a gate current Ig is amplified. The current amplifier 200 forms a so-called current mirror circuit. The gate current Ig is amplified by the N number of transistors in the current amplifier 200 to become N times as large as the gate current Ig. Accordingly, as N is larger, the current is amplified more. The transistor 1b may be the above-described transistor including an oxide semiconductor, and a plurality of such transistors may be provided in the photosensor 201. The transistor ka may be the above-described transistor including the light-blocking layer, or may be a transistor that does not include an oxide semiconductor.

Next, an example of measuring the illuminance of light in the circuit illustrated in FIG. 7 will be described. First, 0 V is applied to a source electrode and a drain electrode of the transistor 1b, and −2 V is applied to a gate electrode of the transistor 1b. The application time was more than or equal to 1 ms and less than or equal to 2 ms, and the application frequency was more than or equal to 30 pulses per minute and less than or equal to 60 pulses per minute. However, the application time and the application frequency are not limited to these ranges and may be determined as appropriate by a practitioner. Then, a gate current Ig having a constant value flows into the transistor 1a, and a current Ig having the same amount as the current flowing into the transistor 1a flows into the transistor ka (k is a natural number greater than or equal to 2 and less than or equal to N). In this manner, a current N times as large as the current Ig can be obtained.

As described in this embodiment, the illuminance of light can be measured more accurately by using the combination of the current amplifier 200 and the photosensor 201 including the transistor including the oxide semiconductor. A transistor utilizing an oxide semiconductor having a relatively high mobility, a small S value, and a small off-state current can form a photosensor according to an embodiment of the present invention; therefore, a multifunction semiconductor device can be obtained through a small number of steps. As examples of such a semiconductor device, there are flat panel displays that are capable of double-frame rate driving or quadruple-frame rate driving utilizing a high mobility and provided with a photosensor, RFID (radio frequency identification) devices provided with a photosensor, and the like. Since the refreshing operation of the photosensor is unnecessary in the case where the voltage is applied in a pulsed manner, it is possible to measure the illuminance of light with small power consumption through a high-speed and easy procedure.

This embodiment can be implemented in combination with any of the other embodiments, as appropriate.

(Embodiment 3)

In this embodiment, an RFID tag which is an example to which the transistor including the oxide semiconductor described in the above embodiment is applied will be described with reference to FIG. 21.

The RFID tag of this embodiment includes a memory circuit storing necessary data and exchanges data with the outside using contactless means such as wireless communication. Having these features, the RFID tag can be used for an individual authentication system in which an object is identified by reading individual information of the object, or the like. Note that the RFID tag is required to have extremely high reliability in order to be used for this purpose.

A configuration of the RFID tag will be described with reference to FIG. 21. FIG. 21 is a block diagram illustrating a configuration example of an RFID tag.

Figure 21:
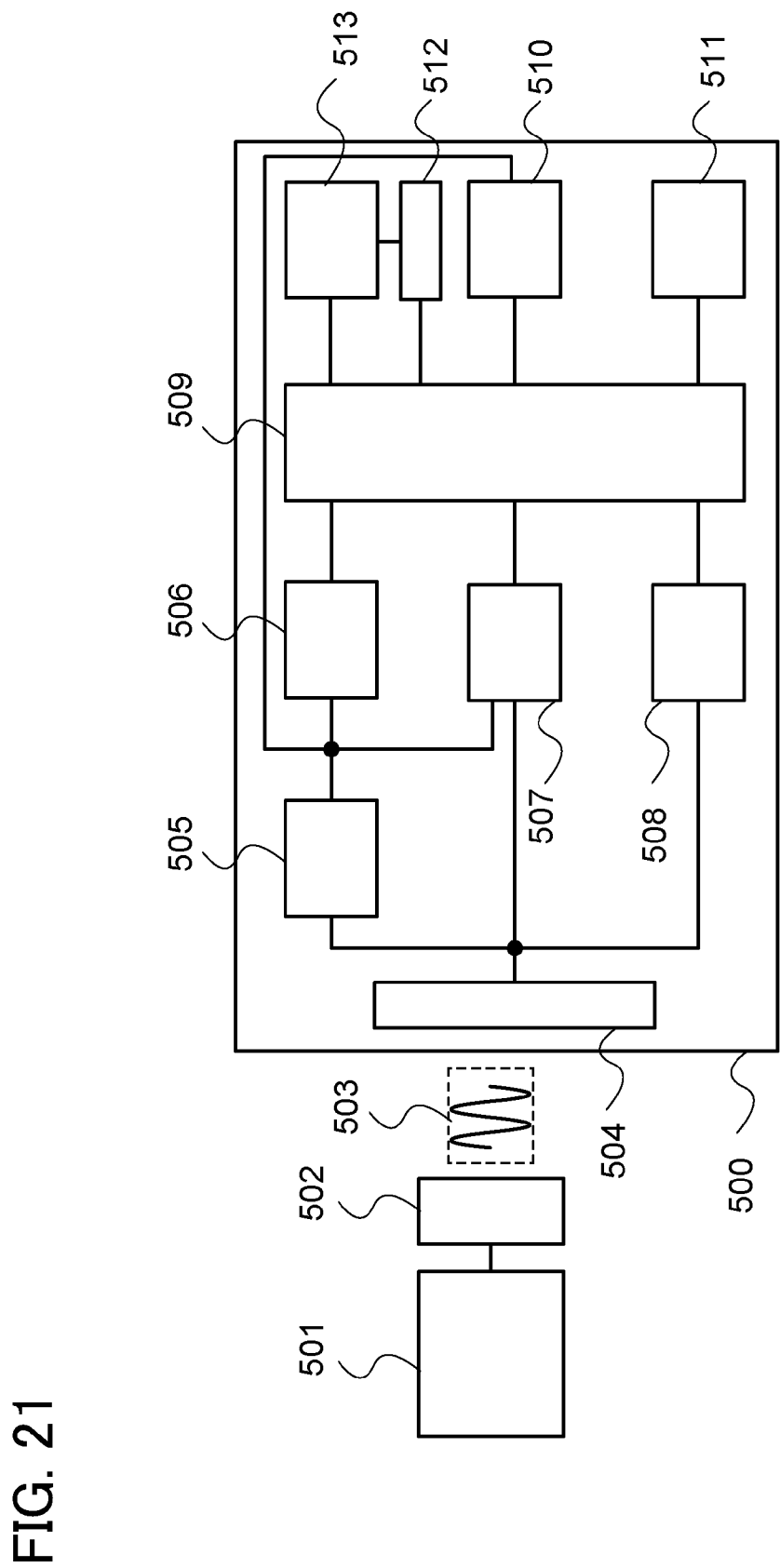
FIG. 21 illustrates an example of a structure of an RFID tag.

As shown in FIG. 21, an RFID tag 500 includes an antenna 504 which receives a radio signal 503 that is transmitted from an antenna 502 connected to a communication device 501 (also referred to as an interrogator, a reader/writer, or the like). The RFID tag 500 includes a rectifier circuit 505, a constant voltage circuit 506, a demodulation circuit 507, a modulation circuit 508, a logic circuit 509, a memory circuit 510, and a ROM 511. In an embodiment of the present invention, a photosensor 513 and an A/D converter 512 are added to the RFID tag 500. A transistor having a rectifying function included in the demodulation circuit 507 preferably includes a material which enables a reverse current to be small enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 500 of this embodiment.

Next, the structure of each circuit will be described. The antenna 504 exchanges the radio signal 503 with the antenna 502 which is connected to the communication device 501. The rectifier circuit 505 generates an input potential by rectification, for example, half-wave voltage doubler rectification of an input alternating signal generated by reception of a radio signal at the antenna 504 and smoothing of the rectified signal with a capacitor provided in a later stage in the rectifier circuit 505. Note that a limiter circuit may be provided on an input side or an output side of the rectifier circuit 505. The limiter circuit controls electric power so that electric power which is higher than or equal to certain electric power is not input to a circuit in a later stage if the amplitude of the input alternating signal is high and an internal generation voltage is high.

The constant voltage circuit 506 generates a stable power supply voltage from an input potential and supplies it to each circuit. Note that the constant voltage circuit 506 may include a reset signal generation circuit. The reset signal generation circuit is a circuit which generates a reset signal of the logic circuit 509 by utilizing rise of the stable power supply voltage.

The demodulation circuit 507 demodulates the input alternating signal by envelope detection and generates the demodulated signal. Further, the modulation circuit 508 performs modulation in accordance with data to be output from the antenna 504.

The logic circuit 509 analyzes and processes the demodulated signal. The memory circuit 510 holds the input data and includes a row decoder, a column decoder, a memory region, and the like. Further, the ROM 511 stores an identification number (ID) or the like and outputs it in accordance with processing.

Note that any of the above-described circuits may be omitted as appropriate.

In this embodiment, the photosensor 513 according to an embodiment of the present invention is provided in the RFID tag 500. Therefore, the memory circuit 510 can record data about light such as the amount of light the RFID tag 500 receives. For example, the RFID tag 500 is set in a cultivated field and keeps receiving a signal from the communication device 501, so that the yearly amount of sunshine or the like can be recorded. In this case, since a voltage is applied in a pulsed manner to the photosensor 513, an oscillator circuit is preferably provided in the communication device 501. This data is useful for a producer to investigate a relation between the amount of sunshine in the cultivated field and the quality of a harvest and the like and serves as a criterion for a consumer to decide to buy the harvest.

At least part of the demodulation circuit 507 and the photosensor can be manufactured in the same process, a multifunction semiconductor device can be obtained through a small number of steps. In this specification, a channel of a transistor forming part of the demodulation circuit 507 and a channel of the transistor forming part of the photosensor 513 are regarded as including the same material because these channels are formed through the same process. Further, since the refreshing operation of the photosensor is unnecessary in the case where the voltage is applied in a pulsed manner, it is possible to measure the illuminance of light with small power consumption through a high-speed and easy procedure.

This embodiment can be implemented in combination with any of the other embodiments, as appropriate.

(Embodiment 4)

In this embodiment, a manufacturing process of an active matrix substrate which is an example of a semiconductor device will be described with reference to drawings. Note that the manufacturing process described in this embodiment and the manufacturing process described in the previous embodiment have many points in common. Therefore, in the following description, repeated description of the same portions is omitted, and different points are described in detail. Note that in the following description, FIGS. 8A to 8C and FIGS. 9A to 9C are cross-sectional views and FIG. 10 is a plan view. In addition, line A1-A2 and line B1-B2 in each of FIGS. 8A to 8C and FIGS. 9A to 9C correspond to line A1-A2 and line B1-B2 in FIG. 10, respectively. Note that in this embodiment, a semiconductor element illustrated in a region along line A1-A2 is a bottom-gate transistor.

Figure 8:
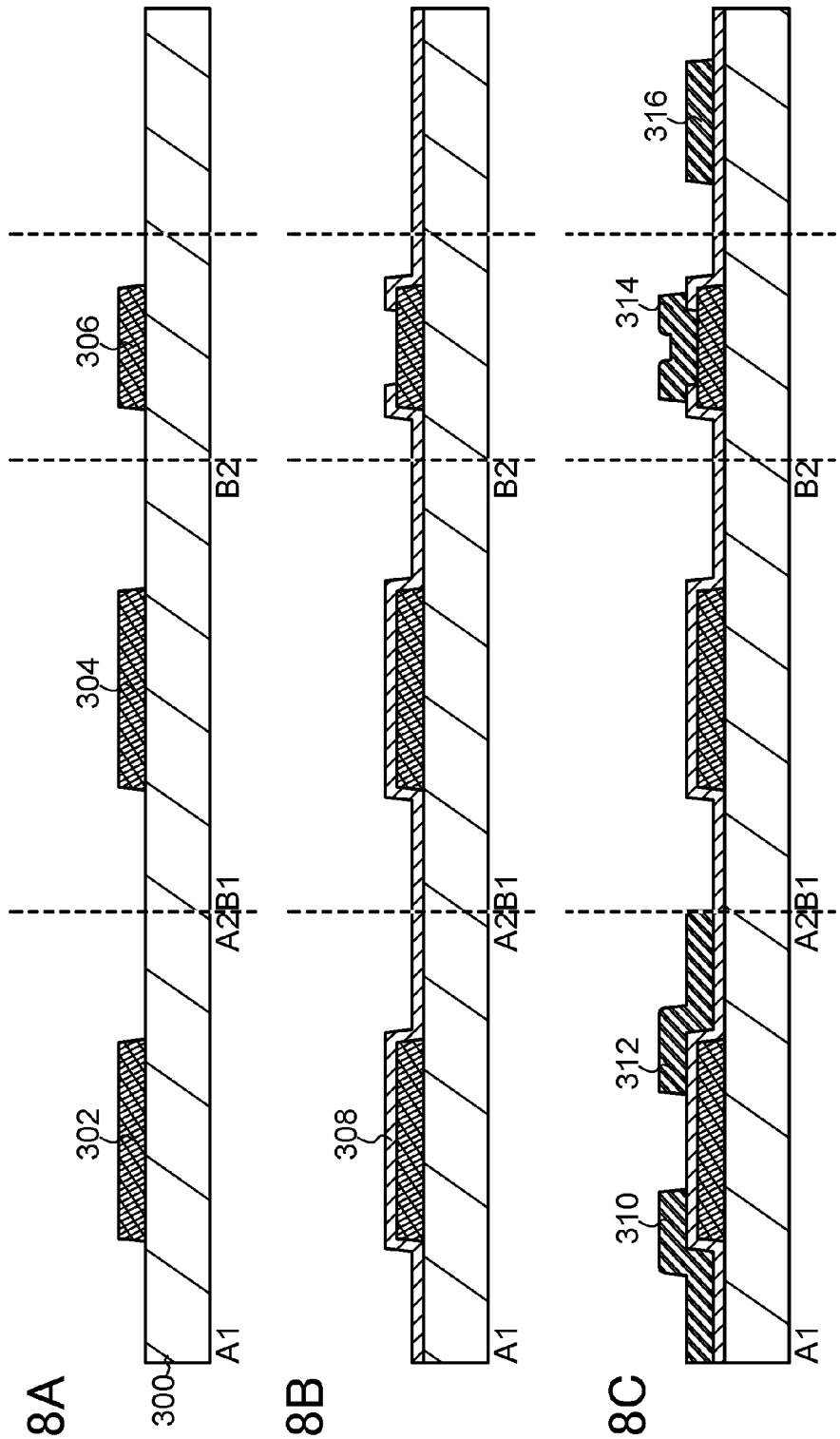
FIGS. 8A to 8C are cross-sectional views illustrating a manufacturing method of a semiconductor device.

First, a wiring and an electrode (a gate electrode 302, a capacitor wiring 304, and a first terminal 306) are formed over a substrate 300 (see FIG. 8A). Specifically, after a conductive layer is formed over the substrate, the wiring and electrode are formed through etching using a resist mask. In this embodiment, the wiring and electrode can be formed by a method similar to the method described in the previous embodiment; therefore, the previous embodiment (e.g., description with reference to FIGS. 1A and 1B) can be referred to for the details. Note that in the above description, the distinction between "an electrode" and "a wiring" is made only for convenience, and their functions are not limited by the denomination of "the electrode" or "the wiring". For instance, a gate electrode may refer to a gate wiring in some cases.

Note that the capacitor wiring 304 and the first terminal 306 can be formed at the same time using a material and a manufacturing method which are the same as those of the gate electrode 302. Therefore, for example, the gate electrode 302 and the first terminal 306 can be electrically connected to each other. The previous embodiment can be referred to for the details of the material and the manufacturing method of the gate electrode 302.

Next, a gate insulating layer 308 is formed over the gate electrode 302 and the gate insulating layer 308 is selectively etched so as to expose the first terminal 306, whereby a contact hole is formed (see FIG. 8B). The previous embodiments (e.g., description with reference to FIG. 1C) can be referred to for the detail of the gate insulating layer 308. There is no particular limitation on the etching treatment; dry etching may be used, or wet etching may be used.

Next, after a conductive layer covering the gate insulating layer 308 and the first terminal 306 is formed, the conductive layer is selectively etched, so that a source electrode 310 (or a drain electrode), a drain electrode 312 (or a source electrode), a connection electrode 314, and a second terminal 316 are formed (see FIG. 8C). Note that in the above description, the distinction between "an electrode" and "a wiring" is made only for convenience, and their functions are not limited by the denomination of "the electrode" or "the wiring". For instance, a source electrode may refer to a source wiring in some cases.

The previous embodiment (e.g., description with reference to FIGS. 2A and 2B) can be referred to for the material, the manufacturing method, the etching treatment, or the like of the above-described conductive layer. Note that by performing dry etching in the etching treatment, a wiring structure can be miniaturized as compared with the case of using wet etching. The connection electrode 314 can be directly connected to the first terminal 306 through the contact hole formed in the gate insulating layer 308. Note also that the second terminal 316 can be electrically connected to the source electrode 310.

Figure 9:
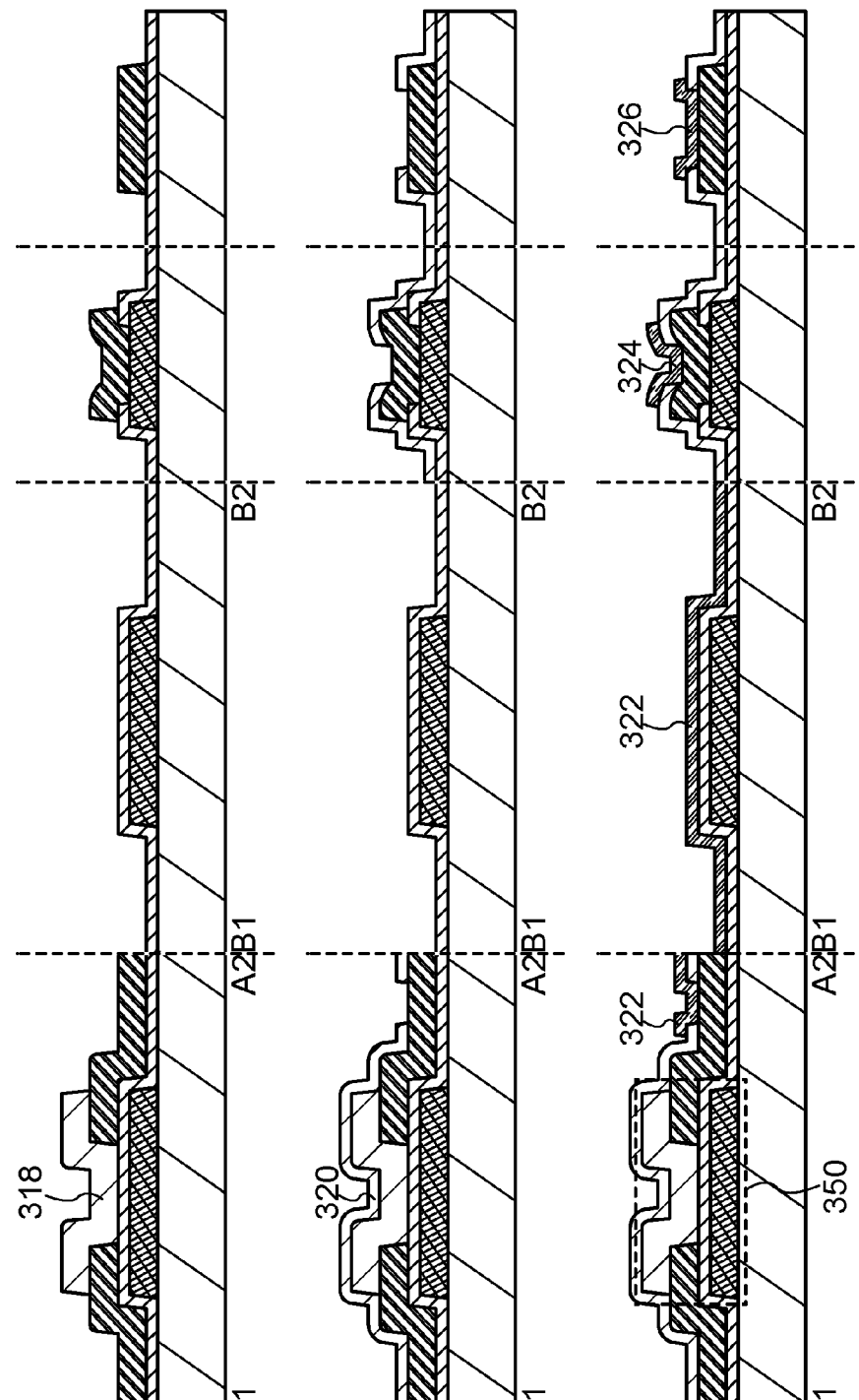
FIGS. 9A to 9C are cross-sectional views illustrating a manufacturing method of a semiconductor device.
Figure 10:
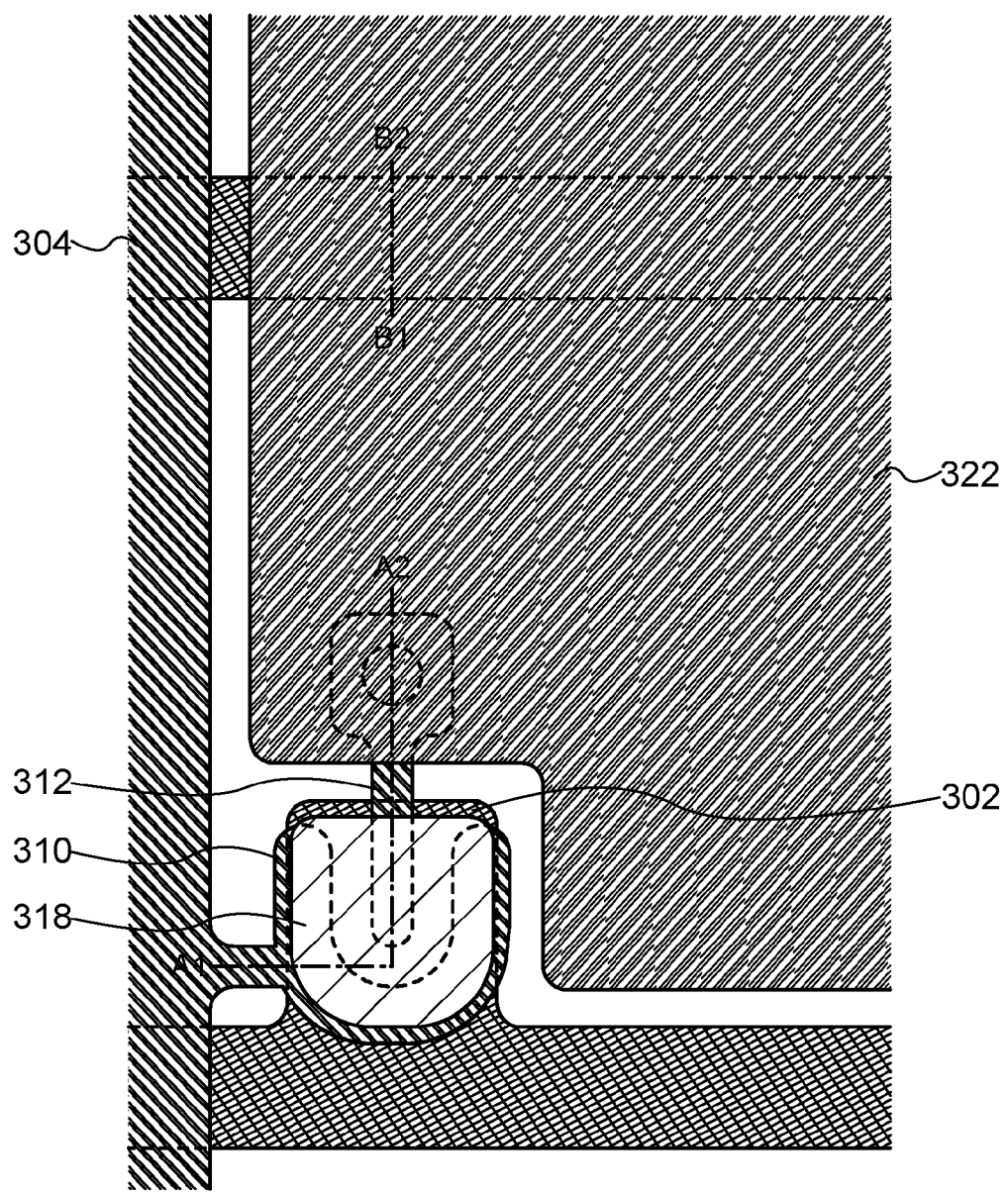
FIG. 10 is a plan view of a semiconductor device.

Next, after an oxide semiconductor layer is formed so as to cover at least the source electrode 310 and the drain electrode 312, the oxide semiconductor layer is selectively etched to form an oxide semiconductor layer 318 (see FIG. 9A). Here, the oxide semiconductor layer 318 is in contact with parts of the source electrode 310 and the drain electrode 312. The previous embodiment (e.g., description with reference to FIGS. 1D and 1E) can be referred to for the detail of the oxide semiconductor layer 318.

After the oxide semiconductor layer 318 is formed, heat treatment at a temperature higher than or equal to 100° C. and lower than or equal to 500° C., typically higher than or equal to 200° C. and lower than or equal to 400° C., is performed. The atmosphere in which the heat treatment is performed can be, for example, an air atmosphere, a nitrogen atmosphere, an oxygen atmosphere, or the like. Further, the heat treatment time can be approximately more than or equal to 0.1 hours and less than or equal to 5 hours. Here, the heat treatment is performed at 350° C. in an air atmosphere for one hour. Note that the timing of the heat treatment is not particularly limited as long as it is after the oxide semiconductor layer 318 is formed and before an insulating layer serving as an interlayer insulating layer is formed. For example, the heat treatment may be performed just after the oxide semiconductor layer 318 is formed. By performing the heat treatment (the first heat treatment) and the following heat treatment (the second heat treatment), characteristics of the semiconductor element can be improved and variation in characteristics can be suppressed.

Note that it is preferable that the heat treatment be performed at 400° C. or lower so as not to change (deteriorate) characteristics of the gate insulating layer 308. Needless to say, an embodiment of the invention disclosed herein should not be interpreted as being limited thereto.

Then, an insulating layer 320 is formed so as to cover the source electrode 310, the drain electrode 312, the oxide semiconductor layer 318, and the like, and the insulating layer 320 is selectively etched so as to form contact holes which reach the drain electrode 312, the connection electrode 314, and the second terminal 316 (see FIG. 9B). The insulating layer 320 is formed using a material such as silicon oxide, aluminum oxide, or tantalum oxide. The insulating layer 320 may also be formed by stacking films formed of these materials.

The hydrogen concentration in the insulating layer 320 is preferably $1\times10^{21}$ atoms/cm$^3$ or lower (preferably $5\times10^{20}$ atoms/cm$^3$ or lower). In addition, the nitrogen concentration in the insulating layer 320 is preferably $1\times10^{19}$ atoms/cm$^3$ or lower. Note that the above-described concentrations mean average values in the insulating layer 320.

As a more specific example of the insulating layer 320 which fulfills the above-described conditions, silicon oxide formed by a sputtering method can be given. This is because the hydrogen concentration in the film can be easily reduced in a sputtering method. Needless to say, any of other methods including a plasma CVD method may be employed as long as the above conditions are fulfilled. The other conditions of the insulating layer 320 are not particularly limited. For example, the thickness of the insulating layer 320 can vary within a feasible range.

Next, a transparent conductive layer 322 which is electrically connected to the drain electrode 312, a transparent conductive layer 324 which is electrically connected to the connection electrode 314, and a transparent conductive layer 326 which is electrically connected to the second terminal 316 are formed (see FIG. 9C and FIG. 10).

The transparent conductive layer 322 functions as a pixel electrode, and the transparent conductive layers 324 and 326 function as an electrode or a wiring used for connection with flexible printed circuits (FPCs). More specifically, the transparent conductive layer 324 formed over the connection electrode 314 can be used as a terminal electrode for connection which functions as an input terminal of a gate wiring, and the transparent conductive layer 326 formed over the second terminal 316 can be used as a terminal electrode for connection which functions as an input terminal of a source wiring.

In addition, a storage capacitor can be formed using the capacitor wiring 304, the gate insulating layer 308, and the transparent conductive layer 322.

The transparent conductive layers 322, 324, and 326 can be formed using a material such as indium oxide ($In_2O_3$), indium tin oxide ($In_2O_3$—$SnO_2$, also abbreviated as ITO), an indium-oxide zinc-oxide alloy ($In_2O_3$—$ZnO$), or the like. For example, the transparent conductive layers 322, 324, and 326 can be formed by a sputtering method, a vacuum evaporation method, or the like in combination with an etching method.

In addition, after the conductive layers 322, 324, and 326 are formed, heat treatment is performed at a temperature higher than or equal to 100° C. and lower than or equal to 500° C., typically higher than or equal to 200° C. and lower than or equal to 400° C. The atmosphere in which the heat treatment is performed can be, for example, an air atmosphere, a nitrogen atmosphere, an oxygen atmosphere, or the like. Further, the heat treatment time can be approximately more than or equal to 0.1 hours and less than or equal to 5 hours. Here, the heat treatment is performed at 350° C. in an air atmosphere for one hour. Note that the timing of the heat treatment is not particularly limited as long as it is after the insulating layer 320 is formed. For example, the above-described heat treatment may be performed just after the insulating layer 320 is formed. Alternatively, the above-described heat treatment may be performed after the contact holes are formed in the insulating layer 320. Further alternatively, the above-described heat treatment may be performed after another insulating layer, conductive layer, or the like is formed. By performing the heat treatment (the second heat treatment) and the preceding heat treatment (the first heat treatment), characteristics of the semiconductor element can be improved and variation in characteristics can be suppressed.

Note that the effect of the second heat treatment is not limited to the above. For example, the second heat treatment also provides an advantageous effect of repairing defects in the insulating layer 320. Since the insulating layer 320 is formed at a relatively low temperature, the film includes defects. Accordingly, the element characteristics might be adversely affected when the insulating layer is used as it is. From a perspective of repairing such defects in the insulating layer 320, it can be said that the above-described heat treatment plays an important role.

Note that it is preferable that the heat treatment be performed at 400° C. or lower so as not to change (deteriorate) characteristics of the gate insulating layer 308. Needless to say, an embodiment of the invention disclosed herein should not be interpreted as being limited thereto.

Through the above-described process, an active matrix substrate including a bottom-gate transistor 350 and an element such as a storage capacitor can be completed. For example, in the case of manufacturing an active matrix liquid crystal display device by using this, a liquid crystal layer may be provided between an active matrix substrate and a counter substrate provided with a counter electrode, and the active matrix substrate and the counter substrate may be fixed to each other.

Since the active matrix substrate described in this embodiment includes a transistor in which the oxide semiconductor layer 318 functions as a channel, a photosensor according to an embodiment of the present invention and a current amplifier can be manufactured in almost the same process. In such a case, a channel of a transistor used as a photosensor and a channel of a transistor used as an oxide semiconductor element other than the photosensor are formed in the same process; therefore, the channels are regarded as including the same material in this specification. A transistor utilizing an oxide semiconductor having a relatively high mobility, a small S value, and a small off-state current can form a photosensor according to an embodiment of the present invention; therefore, a multifunction semiconductor device can be obtained through a smaller number of steps. Since the refreshing operation of the photosensor is unnecessary in the case where the voltage is applied in a pulsed manner, it is possible to measure the illuminance of light with small power consumption through a high-speed and easy measurement procedure.

This embodiment can be implemented in combination with any of the other embodiments, as appropriate.

(Embodiment 5)

In this embodiment, an example is described in which a thin film transistor is manufactured and a semiconductor device having a display function (also referred to as a display device) is manufactured using the thin film transistor in a pixel portion and in a driver circuit. Further, part or whole of a driver circuit can be formed over the same substrate as a pixel portion, whereby a system-on-panel can be obtained.

The display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, may be used.

In addition, the display device includes a panel in which a display element is sealed, and a module in which an IC and the like including a controller are mounted on the panel. Furthermore, an element substrate which forms a display device is provided with a unit for supplying current to the display element in each pixel. Specifically, the element substrate may be in a state after only a pixel electrode of the display element is formed, or a state after a conductive layer to be a pixel electrode is formed and before the conductive layer is etched.

Note that a display device in this specification means an image display device, a display device, a light source (including a lighting device), and the like. Further, the display device also includes the following modules in its category: a module to which a connector such as an FPC (flexible printed circuit), a TAB (tape automated bonding) tape, or a TCP (tape carrier package) is attached; a module in which the tip of the TAB tape or the TCP is provided with a printed wiring board; a module in which an IC (integrated circuit) is directly mounted on a display element by a COG (chip on glass) method, and the like.

Hereinafter, in this embodiment, an example of a liquid crystal display device is described. FIGS. 11A1, 11A2, and 11B are plan views and a cross-sectional view of a panel in which thin film transistors 4010 and 4011 and a liquid crystal element 4013 which are formed over a first substrate 4001 are sealed by a second substrate 4006 and a sealant 4005. Here, FIGS. 11A1 and 11A2 are each a plan view and FIG. 11B is a cross-sectional view taken along line M-N of FIGS. 11A1 and 11A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. In other words, the pixel portion 4002 and the scan line driver circuit 4004 are sealed together with a liquid crystal layer 4008, by the first substrate 4001, the sealant 4005, and the second substrate 4006. Further, a signal line driver circuit 4003 that is formed using a single crystal semiconductor or a polycrystalline semiconductor over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used as appropriate. FIG. 11A1 illustrates an example of mounting the signal line driver circuit 4003 by a COG method, and FIG. 11A2 illustrates an example of mounting the signal line driver circuit 4003 by a TAB method.

In addition, the pixel portion 4002 and the scan line driver circuit 4004 provided over the first substrate 4001 each include a plurality of thin film transistors. FIG. 11B illustrates the thin film transistor 4010 included in the pixel portion 4002 and the thin film transistor 4011 included in the scan line driver circuit 4004. An insulating layer 4020 and an insulating layer 4021 are provided over the thin film transistors 4010 and 4011.

The transistors described in any of the previous embodiments or the like can be applied to the thin film transistors 4010 and 4011. Note that in this embodiment, the thin film transistors 4010 and 4011 are n-channel thin film transistors. Transistors similar to these transistors can be utilized in a photosensor according to an embodiment of the present invention and a current amplifier. Thus, it is possible to manufacture a display device including an oxide semiconductor and a photosensor including an oxide semiconductor over one substrate through almost the same process.

A pixel electrode layer 4030 included in the liquid crystal element 4013 is electrically connected to the thin film transistor 4010. A counter electrode layer 4031 of the liquid crystal element 4013 is formed on the second substrate 4006. The liquid crystal element 4013 is formed by the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, glass, metal (typically, stainless steel), ceramic, plastic, or the like can be used. As plastic, an FRP (fiberglass-reinforced plastics) substrate, a PVF (polyvinyl fluoride) film, a polyester film, an acrylic resin film, or the like can be used. In addition, a sheet with a structure in which an aluminum foil is sandwiched between PVF films or polyester films can be used.

A spacer 4035 is provided in order to control the distance (a cell gap) between the pixel electrode layer 4030 and the counter electrode layer 4031. For example, the spacer 4035 can be obtained by selectively etching an insulating layer. Note that the spacer 4035 may have any of various shapes such as a columnar shape or a spherical shape. In addition, the counter electrode layer 4031 is electrically connected to a common potential line formed over the same substrate as the thin film transistor 4010. For example, the counter electrode layer 4031 can be electrically connected to the common potential line through conductive particles provided between the pair of substrates. Note that the conductive particles are preferably contained in the sealant 4005.

In the case of employing a horizontal electric field mode, a liquid crystal exhibiting a blue phase for which an alignment film is unnecessary may be used. A blue phase is one of the liquid crystal phases, which is generated just before a cholesteric phase changes into an isotropic phase when the temperature of cholesteric liquid crystal is increased. Since the blue phase is only generated within a narrow range of temperatures, a liquid crystal composition containing a chiral agent at 5 wt % or more is preferably used. Thus, the temperature range in which the blue phase is exhibited can be widened. The liquid crystal composition which includes a liquid crystal exhibiting a blue phase and a chiral agent has a small response time of 10 μs to 100 μs, has optical isotropy, which makes the alignment process unneeded, and has a small viewing angle dependence.

Although an example of a transmissive liquid crystal display device is described in this embodiment, the present invention is not limited thereto. An embodiment of the present invention may also be applied to a reflective liquid crystal display device or a semi-transmissive liquid crystal display device.

In this embodiment, an example of liquid crystal display device is described in which a polarizing plate is provided on the outer surface of the substrate (on the viewer side) and a coloring layer and an electrode layer used for a display element are provided on the inner surface of the substrate in this order (see FIG. 12); however, the polarizing plate may be provided on the inner surface of the substrate. In addition, the stacked structure of the polarizing plate and the coloring layer is not limited to this embodiment. The stacked structure can be varied as appropriate in accordance with the material, manufacturing conditions, or the like of the polarizing plate and the coloring layer. Further, a light-blocking layer which functions as a black matrix may be provided.

In this embodiment, in order to suppress the surface roughness of the thin film transistors, the thin film transistors obtained in any of the previous embodiments are covered with the insulating layer 4021. As the insulating layer 4021, an organic material having heat resistance such as polyimide, acrylic resin, benzocyclobutene resin, polyamide, or epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of these materials.

Here, a siloxane-based resin is a resin formed using a siloxane-based material and including a bond of Si—O—Si. As a substituent, an organic group (e.g., an alkyl group or an aryl group) or a fluoro group may be used. In addition, the organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, or a droplet discharge method (e.g., an ink jet method, screen printing, offset printing), or a tool such as a doctor knife, a roll coater, a curtain coater, a knife coater, or the like.

The pixel electrode layer 4030 and the counter electrode layer 4031 can be formed of a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

The pixel electrode layer 4030 and the counter electrode layer 4031 can be formed using a conductive composition containing a conductive high molecule (also referred to as a conductive polymer). The pixel electrode made of the conductive composition preferably has a sheet resistance of $1.0 \times 10^4$ Ω/sq. or less and a transmittance of 70% or more at a wavelength of 550 nm. Furthermore, the resistivity of the conductive high molecule contained in the conductive composition is preferably 0.1 Ω·cm or less.

As the conductive high molecule, a π-electron conjugated conductive high molecule can be used for example. Specifically, polyaniline or a derivative thereof, polypyrrole or a derivative thereof, polythiophene or a derivative thereof, a copolymer of two or more of aniline, pyrrole, and thiophene or a derivative thereof, or the like can be given.

A variety of signals are supplied to the signal line driver circuit 4003, the scan line driver circuit 4004, the pixel portion 4002, or the like from an FPC 4018.

In addition, a connection terminal electrode 4015 is formed from the same conductive layer as the pixel electrode layer 4030 included in the liquid crystal element 4013, and a terminal electrode 4016 is formed from the same conductive layer as source and drain electrode layers of the thin film transistors 4010 and 4011.

The connection terminal electrode 4015 is electrically connected to a terminal included in the FPC 4018 through an anisotropic conductive layer 4019.

Note that FIGS. 11A1, 11A2 and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
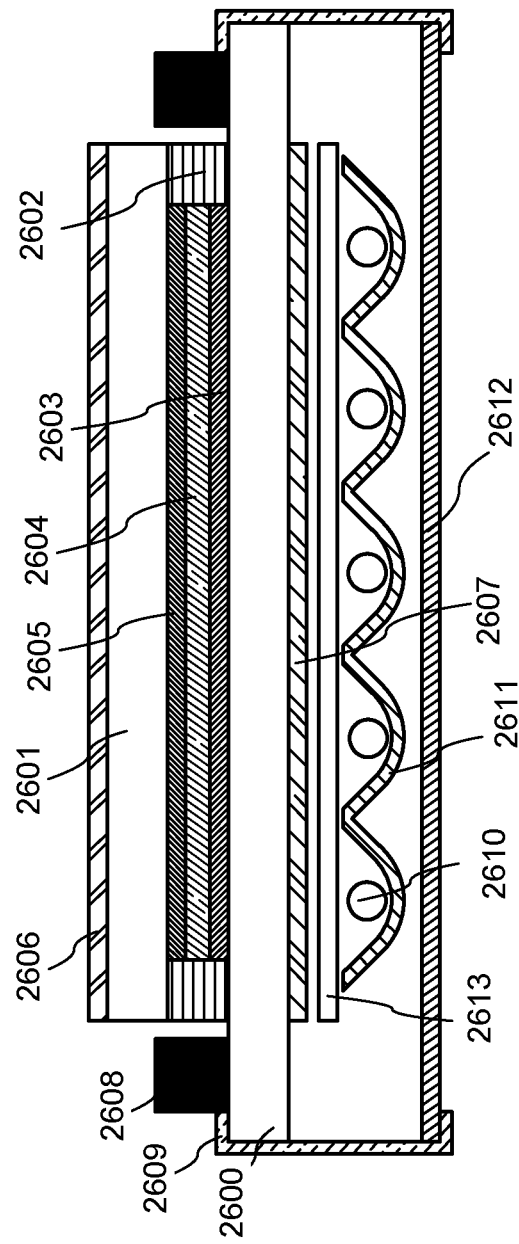
FIG. 12 illustrates a semiconductor device.

FIG. 12 illustrates an example in which a liquid crystal display module corresponding to an embodiment of a semiconductor device is formed using a substrate 2600 over which an oxide semiconductor element is formed.

In FIG. 12, the substrate 2600 over which an oxide semiconductor element is formed and a counter substrate 2601 are bonded to each other by a sealant 2602 and an element layer 2603 including an oxide semiconductor element and the like, a liquid crystal layer 2604 including an alignment film and a liquid crystal layer, a coloring layer 2605, a polarizing plate 2606, and the like are provided between the substrate 2600 and the counter substrate 2601, whereby a display region is formed. The coloring layer 2605 is necessary to perform color display. In the case of the RGB system, coloring layers corresponding to colors of red, green, and blue are provided for pixels. Polarizing plates 2606 and 2607 and a diffusion plate 2613 are provided outside the substrate 2600 over which an oxide semiconductor element is formed and the counter substrate 2601. A light source includes a cold cathode tube 2610 and a reflective plate 2611. A circuit board 2612 is connected to a wiring circuit portion 2608 of the substrate 2600 over which an oxide semiconductor element is formed through a flexible wiring board 2609. Thus, an external circuit such as a control circuit or a power source circuit is included in a liquid crystal module. A retardation plate may be provided between the polarizing plate and the liquid crystal layer.

For a driving method of a liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above-described process, a high-performance liquid crystal display device provided with a photosensor can be manufactured. Since the liquid crystal display device includes a transistor in which an oxide semiconductor layer functions as a channel, a photosensor according to an embodiment of the present invention and a current amplifier can be manufactured in almost the same process. In such a case, a channel of a transistor used as a photosensor and the channel of the transistor used as an oxide semiconductor element other than the photosensor are formed in the same process; therefore, the channels are regarded as including the same material in this specification. A transistor utilizing an oxide semiconductor having a relatively high mobility, a small S value, and a small off-state current can form a photosensor according to an embodiment of the present invention; therefore, a multifunction semiconductor device can be obtained through a small number of steps. Since the refreshing operation of the photosensor is unnecessary in the case where the voltage is applied in a pulsed manner, it is possible to measure the illuminance of light with small power consumption through a high-speed and easy measurement procedure. This enables a rapid change of external light to be detected by the photosensor; accordingly, the luminance of the display device can be adjusted speedily and smoothly.

This embodiment can be implemented in combination with any of the other embodiments, as appropriate.

(Embodiment 6)

In this embodiment, active matrix electronic paper which is an example of a semiconductor device will be described with reference to FIG. 13. A thin film transistor 650 used for the semiconductor device can be manufactured in a manner similar to that of the transistor or the like described in any of the previous embodiments. A transistor similar to the transistor 650 can be used to manufacture a photosensor according to an embodiment of the present invention; accordingly, electronic paper whose display state is changed in response to light can be obtained.

Figure 13:
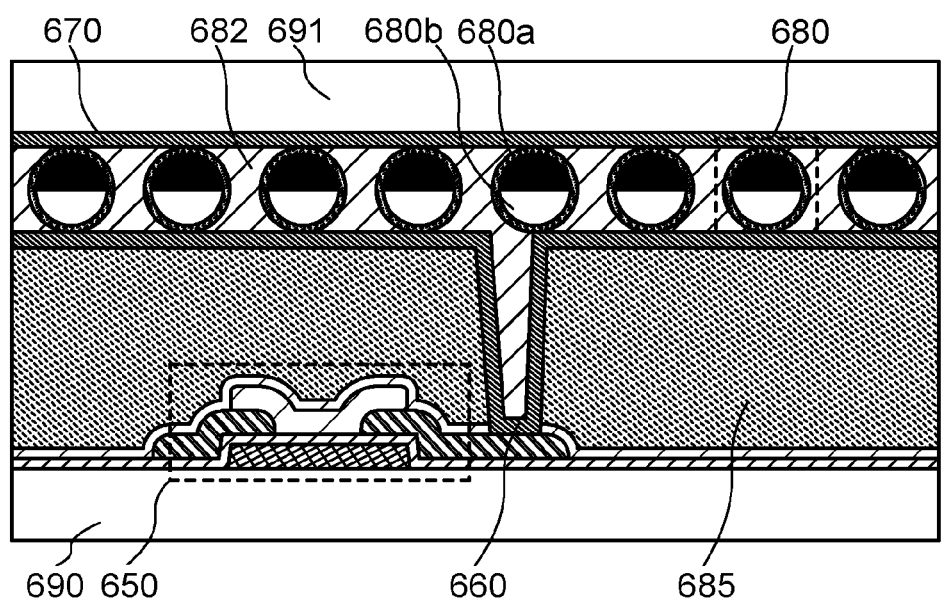
FIG. 13 illustrates a semiconductor device.

The electronic paper in FIG. 13 is an example of electronic paper using a twisting ball display system. The twisting ball display system refers to a method for performing display in which spherical particles each colored in black and white are arranged between a first electrode layer and a second electrode layer, and a potential difference is generated between the first electrode layer and the second electrode layer to control orientation of the spherical particles.

A source or drain electrode layer of the thin film transistor 650 provided over a substrate 690 is electrically connected to a first electrode 660 through a contact hole formed in an insulating layer 685. A substrate 691 is provided with a second electrode 670. Between the first electrode 660 and the second electrode 670, spherical particles 680 each having a black region 680a and a white region 680b are provided. A space around the spherical particles 680 is filled with a filler 682 such as a resin (see FIG. 13). In FIG. 13, the first electrode 660 corresponds to a pixel electrode, and the second electrode 670 corresponds to a common electrode. The second electrode 670 is electrically connected to a common potential line provided over the same substrate as the thin film transistor 650.

Instead of the twisting ball, an electrophoretic display element can also be used. In that case, for example, a microcapsule having a diameter of approximately 10 μm to 200 μm in which transparent liquid, positively-charged white microparticles, and negatively-charged black microparticles are encapsulated, is preferably used. When an electric field is applied between the first electrode and the second electrode, the white microparticles and the black microparticles move to opposite directions from each other, so that white or black is displayed. The electrophoretic display element has higher reflectance than a liquid crystal display element, and thus, an auxiliary light is unnecessary and a display portion can be recognized in a place where brightness is not sufficient. In addition, there is an advantage that even when power is not supplied to the display portion, an image which has been displayed once can be maintained.

Through the above-described process, high-performance electronic paper can be manufactured. Since the electronic paper includes a transistor in which an oxide semiconductor layer functions as a channel, a photosensor according to an embodiment of the present invention and a current amplifier can be manufactured in almost the same process. In such a case, a channel of a transistor used as the photosensor and the channel of the transistor used as an oxide semiconductor element other than the photosensor are formed in the same process; therefore, the channels are regarded as including the same material in this specification. A transistor utilizing an oxide semiconductor having a relatively high mobility, a small S value, and a small off-state current can form a photosensor according to an embodiment of the present invention; therefore, a multifunction semiconductor device can be obtained through a small number of steps. Since the refreshing operation of the photosensor is unnecessary in the case where the voltage is applied in a pulsed manner, it is possible to measure the illuminance of light with small power consumption through a high-speed and easy measurement procedure. This enables a rapid change of external light to be detected by the photosensor; accordingly, the display state of the electronic paper can be changed speedily depending on external light. For example, the display of the electronic paper provided outside can be automatically changed depending on the illuminance of external light; in such a case, the displayed advertisement can be changed in accordance with the weather.

This embodiment can be implemented in combination with any of the other embodiments, as appropriate.
(Embodiment 7)

In this embodiment, a light-emitting display device which is an example of a semiconductor device will be described. Here, a case is described in which a light-emitting element utilizing electroluminescence is used as a display element. Note that light-emitting elements utilizing electroluminescence are classified by whether a light-emitting material is an organic compound or an inorganic compound. In general, the former is called an organic EL element, and the latter is called an inorganic EL element.

In an organic EL element, by application of a voltage to a light-emitting element, electrons and holes are separately injected from a pair of electrodes into a layer containing a light-emitting organic compound. Then, the carriers (electrons and holes) recombine, thereby emitting light. Owing to such a mechanism, the light-emitting element is called a current-excitation light-emitting element.

The inorganic EL elements are classified into a dispersion-type inorganic EL element and a thin-film-type inorganic EL element depending on the element structure. A dispersion-type inorganic EL element has a light-emitting layer where particles of a light-emitting material are dispersed in a binder, and its light emission mechanism is donor-acceptor recombination-type light emission which utilizes a donor level and an acceptor level. A thin-film-type inorganic EL element has a structure in which a light-emitting layer is sandwiched between dielectric layers, which are further sandwiched between electrodes, and its light emission mechanism is localized-type light emission that utilizes inner-shell electron transition of metal ions. Note that, here, description is made on an organic EL element.

Structures of the light-emitting element are described with reference to FIGS. 14A to 14C. Here, a cross-sectional structure of a pixel is described by taking an n-channel driving TFT as an example. Transistors 701, 711, and 721 used for semiconductor devices illustrated in FIGS. 14A to 14C can be manufactured in a manner similar to that of the transistors described in the previous embodiments. A transistor similar to these transistors can be utilized in a photosensor according to an embodiment of the present invention and a current amplifier. Thus, it is possible to manufacture a light-emitting display device including an oxide semiconductor and a photosensor including an oxide semiconductor over one substrate through almost the same process.

In order to extract light from a light-emitting element, at least one of the anode and the cathode is transparent. Here, the term "being transparent" means having a sufficiently high transmittance to at least a wavelength of emitted light. As a method for extracting light, in the case where a thin film transistor and a light-emitting element are formed over a substrate, there are a top emission method (a top extraction method) in which light is extracted without passing through the substrate, a bottom emission method (a bottom extraction method) in which light is extracted through the substrate, a dual emission method (a dual extraction method) in which light is extracted from both an upper surface and a lower surface, and the like.

A top-emission-type light-emitting element will be described with reference to FIG. 14A.

Figure 14A:
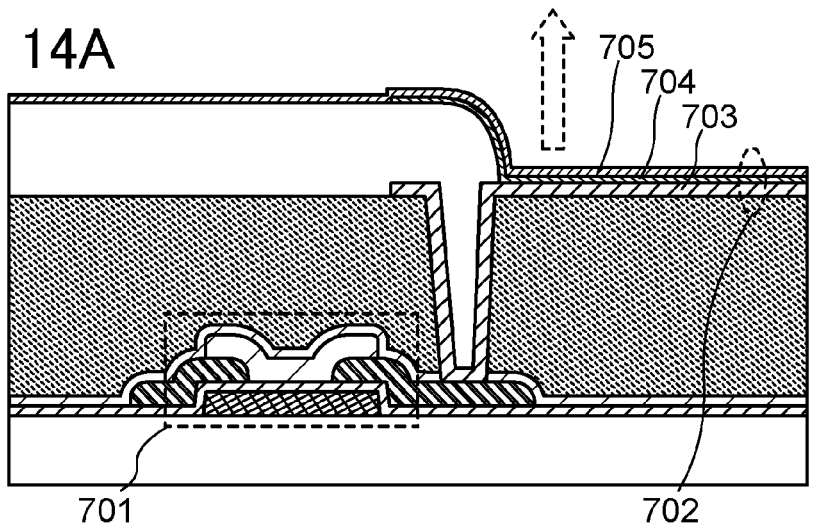
FIGS. 14A to 14C illustrate semiconductor devices.

FIG. 14A is a cross-sectional view of a pixel in the case where light emitted from a light-emitting element 702 is extracted through an anode 705. Here, a cathode 703 of the light-emitting element 702 and the transistor 701 which is a driving transistor are electrically connected to each other, and a light-emitting layer 704 and the anode 705 are stacked in this order over the cathode 703. As the cathode 703, a conductive layer which has a low work function and reflects light can be used. For example, a material such as Ca, Al, MgAg, or AlLi is preferably used to form the cathode 703. The light-emitting layer 704 may be formed to have either a single-layer structure or a stacked structure. As an example of the stacked structure, an electron-injection layer, an electron-transport layer, a light-emitting layer, a hole-transport layer, and a hole-injection layer may be stacked in this order over the cathode 703; however, needless to say, it is not necessary to form all of these layers and another structure may be employed. The anode 705 is formed using a light-transmitting conductive material. For example, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added may be used.

A structure in which the light-emitting layer 704 is sandwiched between the cathode 703 and the anode 705 can be called the light-emitting element 702. In the case of the pixel illustrated in FIG. 14A, light emitted from the light-emitting element 702 is extracted through the anode 705 as indicated by an arrow.

Next, a bottom-emission-type light-emitting element will be described with reference to FIG. 14B.

Figure 14B:
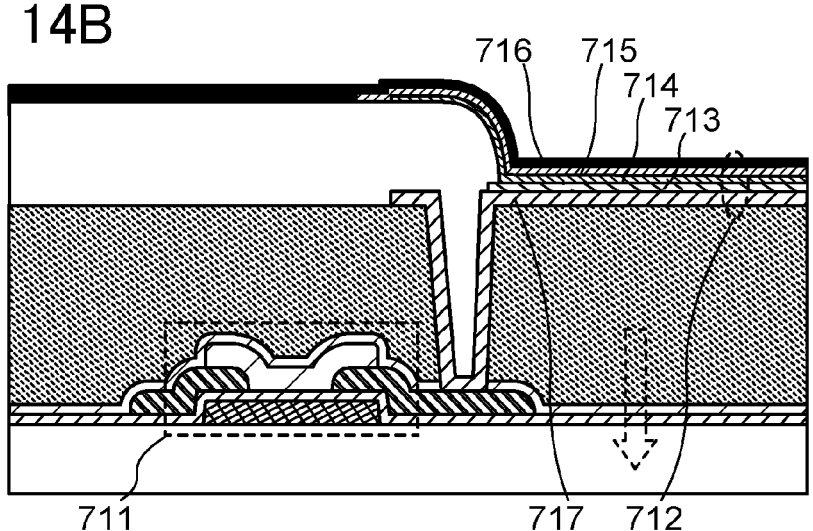

FIG. 14B is a cross-sectional view of a pixel in the case where light emitted from a light-emitting element 712 is extracted through a cathode 713. Here, the cathode 713 of the light-emitting element 712 is formed over a light-transmitting conductive layer 717 which is electrically connected to the driving transistor 711, and a light-emitting layer 714 and an anode 715 are stacked in this order over the cathode 713. Note that a blocking layer 716 may be formed so as to cover the anode 715 when the anode 715 has a light-transmitting property. The cathode 713 can be formed using a conductive material having a low work function in a manner similar to that of the case of FIG. 14A. Note that the cathode 713 is formed to such a thickness as to transmit light (preferably, approximately 5 nm to 30 nm). For example, an aluminum film with a thickness of approximately 20 nm can be used as the cathode 713. In a manner similar to that of the case of FIG. 14A, the light-emitting layer 714 may be formed to have either a single-layer structure or a stacked structure. The anode 715 is not required to transmit light, but may be formed using a light-transmitting conductive material in a manner similar to that of the case of FIG. 14A. As the blocking layer 716, a metal which reflects light or the like can be used; however, it is not limited thereto. For example, a resin to which a black pigment is added or the like can also be used.

A structure in which the light-emitting layer 714 is sandwiched between the cathode 713 and the anode 715 can be called the light-emitting element 712. In the case of the pixel illustrated in FIG. 14B, light emitted from the light-emitting element 712 is extracted from the cathode 713 as indicated by an arrow.

Next, a dual-emission-type light-emitting element will be described with reference to FIG. 14C.

Figure 14C:
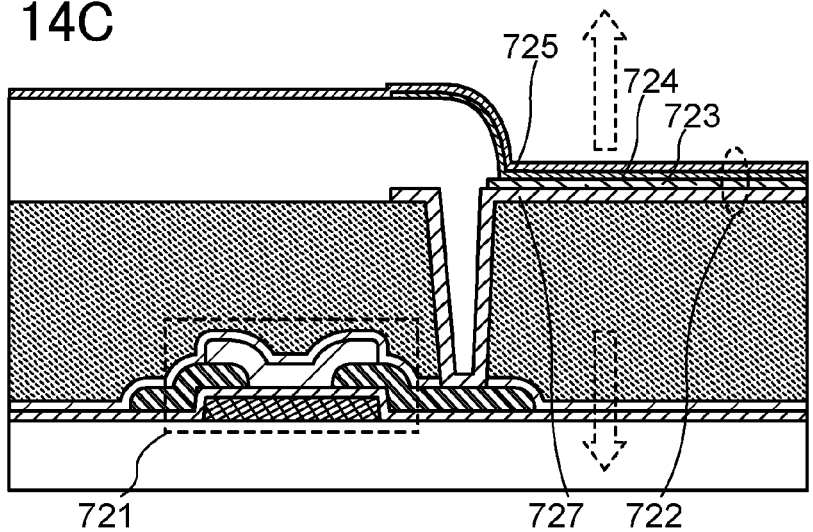

In FIG. 14C, a cathode 723 of a light-emitting element 722 is formed over a light-transmitting conductive layer 727 which is electrically connected to the driving transistor 721, and a light-emitting layer 724 and an anode 725 are stacked in this order over the cathode 723. The cathode 723 can be formed using a conductive material having a low work function in a manner similar to that of the case of FIG. 14A. Note that the cathode 723 is formed to such a thickness as to transmit light. For example, an aluminum film with a thickness of 20 nm can be used as the cathode 723. In a manner similarly to that of the case of FIG. 14A, the light-emitting layer 724 may have either a single-layer structure or a stacked structure. In a manner similar to that of the case of FIG. 14A, the anode 725 can be formed using a light-transmitting conductive material.

A structure where the cathode 723, the light-emitting layer 724, and the anode 725 overlap with one another can be called the light-emitting element 722. In the case of the pixel illustrated in FIG. 14C, light emitted from the light-emitting element 722 is extracted through both the anode 725 and the cathode 723 as indicated by arrows.

Although a case of using an organic EL element as a light-emitting element is described here, an inorganic EL element can also be used as a light-emitting element. The example is described here in which a thin film transistor (a driving transistor) which controls the driving of a light-emitting element is electrically connected to the light-emitting element; however, a transistor for current control or the like may be connected between the driving transistor and the light-emitting element.

Note that the structure of the semiconductor device described in this embodiment is not limited to those illustrated in FIGS. 14A to 14C and can be modified in various ways.

Figure 15A:
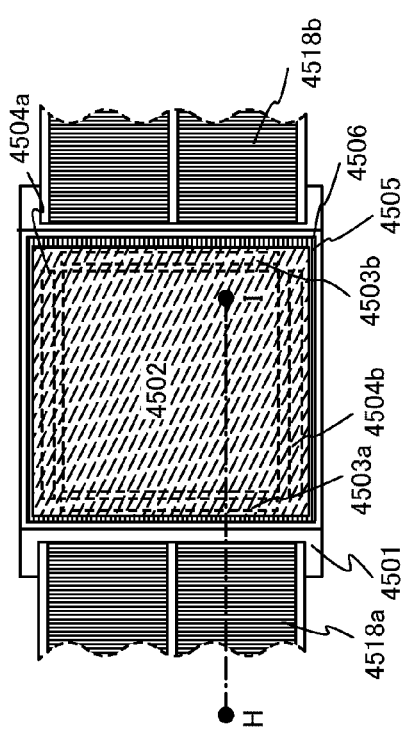
FIGS. 15A and 15B illustrate a semiconductor device.
Figure 15B:
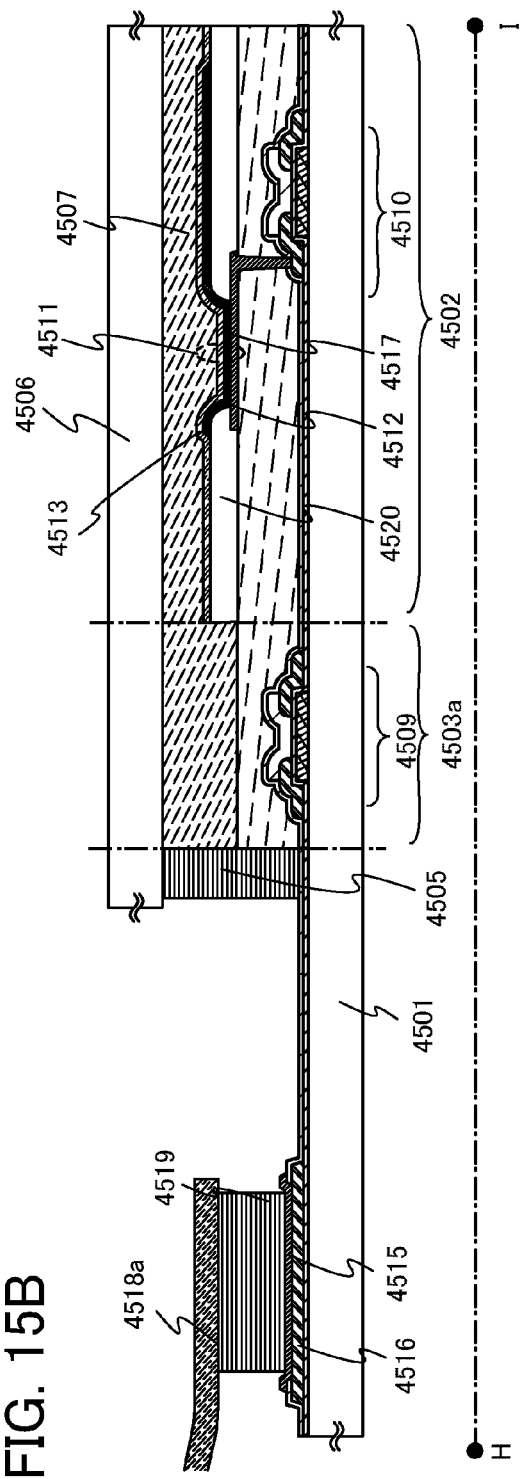

Next, the appearance and a cross section of a light-emitting display panel (also referred to as a light-emitting panel) will be described with reference to FIGS. 15A and 15B. FIGS. 15A and 15B are a plan view and a cross-sectional view of a panel in which thin film transistors 4509 and 4510 and a light-emitting element 4511 which are formed over a first substrate 4501 are sealed by a second substrate 4506 and a sealant 4505. FIG. 15A is a plan view and FIG. 15B is a cross-sectional view taken along line H-I in FIG. 15A.

The sealant 4505 is provided so as to surround a pixel portion 4502, signal line driver circuits 4503a and 4503b, and scan line driver circuits 4504a and 4504b, which are provided over the first substrate 4501. In addition, the second substrate 4506 is provided over the pixel portion 4502, the signal line driver circuits 4503a and 4503b, and the scan line driver circuits 4504a and 4504b. In other words, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. Packaging (sealing) is preferably performed using a protective film (such as a bonding film or an ultraviolet curable resin film), a cover material, or the like with high air-tightness and little degasification.

The pixel portion 4502, the signal line driver circuits 4503a and 4503b, and the scan line driver circuits 4504a and 4504b, which are formed over the first substrate 4501, each include a plurality of thin film transistors. In FIG. 15B, the thin film transistor 4510 included in the pixel portion 4502 and the thin film transistor 4509 included in the signal line driver circuit 4503a are illustrated as an example.

As the thin film transistors 4509 and 4510, any of the transistors described in the previous embodiments can be employed. Note that in this embodiment, the thin film transistors 4509 and 4510 are n-channel thin film transistors. A transistor similar to these transistors can be utilized in a photosensor according to an embodiment of the present invention and a current amplifier. Thus, it is possible to manufacture a light-emitting display device including an oxide semiconductor and a photosensor including an oxide semiconductor over one substrate through almost the same process.

Moreover, a first electrode 4517 that is a pixel electrode of the light-emitting element 4511 is electrically connected to a source electrode or a drain electrode of the thin film transistor 4510. The structure of the light-emitting element 4511 is a stacked structure of the first electrode 4517, an electroluminescent layer 4512, and a second electrode 4513; however, it is not limited to the structure described in this embodiment. The structure of the light-emitting element 4511 can be changed as appropriate depending on the direction in which light is extracted from the light-emitting element 4511, or the like.

A partition 4520 is formed using an organic resin, an inorganic insulating layer, organopolysiloxane, or the like. It is particularly preferable that the partition 4520 be formed of a photosensitive material to have an opening over the first electrode 4517 so that a sidewall of the opening is formed as an inclined surface with continuous curvature.

The electroluminescent layer 4512 may have either a single-layer structure or a stacked structure.

A protective film may be formed over the second electrode 4513 and the partition 4520 in order to prevent oxygen, hydrogen, moisture, carbon dioxide, or the like from entering the light-emitting element 4511. The protective film can be formed using silicon nitride, silicon nitride oxide, DLC (diamond like carbon), or the like.

A variety of signals are supplied to the signal line driver circuits 4503a and 4503b, the scan line driver circuits 4504a and 4504b, the pixel portion 4502, or the like from FPCs 4518a and 4518b.

In this embodiment, an example is described in which a connection terminal electrode 4515 is formed from the same conductive layer as the first electrode 4517 of the light-emitting element 4511, and a terminal electrode 4516 is formed from the same conductive layer as the source and drain electrodes of the thin film transistors 4509 and 4510.

The connection terminal electrode 4515 is electrically connected to a terminal of the FPC 4518a through an anisotropic conductive layer 4519.

The substrate located in the direction in which light is extracted from the light-emitting element 4511 needs to have a light-transmitting property. As a substrate having a light-transmitting property, a glass plate, a plastic plate, a polyester film, an acrylic film, and the like are given.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. In this embodiment, an example in which nitrogen is used for the filler is described.

If needed, an optical film, such as a polarizing plate, a circularly polarizing plate (including an elliptically polarizing plate), a retardation plate (a quarter-wave plate or a half-wave plate), or a color filter, may be provided on a surface on the light-emission side of the light-emitting element. Furthermore, antireflection treatment may be performed on a surface of the light-emitting element. For example, anti-glare treatment by which reflected light can be diffused by projections and depressions on the surface can be performed for suppressing the glare.

The signal line driver circuits 4503a and 4503b and the scan line driver circuits 4504a and 4504b may be formed using a single crystal semiconductor or a polycrystalline semiconductor over a substrate separately prepared. Alternatively, only the signal line driver circuits or part thereof, or only the scan line driver circuits or part thereof may be separately formed and mounted. This embodiment is not limited to the structure illustrated in FIGS. 15A and 15B.

Through the above-described process, a high-performance light-emitting display device (display panel) provided with a photosensor can be manufactured. Since the light-emitting display device includes a transistor in which an oxide semiconductor layer functions as a channel, a photosensor according to an embodiment of the present invention and a current amplifier can be manufactured in almost the same process. In such a case, a channel of a transistor used as the photosensor and the channel of the transistor used as an oxide semiconductor element other than the photosensor are formed in the same process; therefore, the channels are regarded as including the same material in this specification. A transistor utilizing an oxide semiconductor having a relatively high mobility, a small S value, and a small off-state current can form a photosensor according to an embodiment of the present invention; therefore, a multifunction semiconductor device can be obtained through a small number of steps. Since the refreshing operation of the photosensor is unnecessary in the case where the voltage is applied in a pulsed manner, it is possible to measure the illuminance of light with small power consumption through a high-speed and easy measurement procedure. This enables a rapid change of external light to be detected by the photosensor; accordingly, the luminance of the display device can be adjusted speedily and smoothly.

This embodiment can be implemented in combination with any of the other embodiments, as appropriate.

(Embodiment 8)

An example of electronic paper provided with a photosensor according to an embodiment of the present invention will be described. Electronic paper can be used for electronic devices of a variety of fields. For example, electronic paper can be applied to an electronic book reader (e-book), a poster, an advertisement in a vehicle such as a train, displays of various cards such as a credit card, and the like. Examples of the electronic devices are illustrated in FIGS. 16A and 16B and FIG. 17.

Figure 16A:
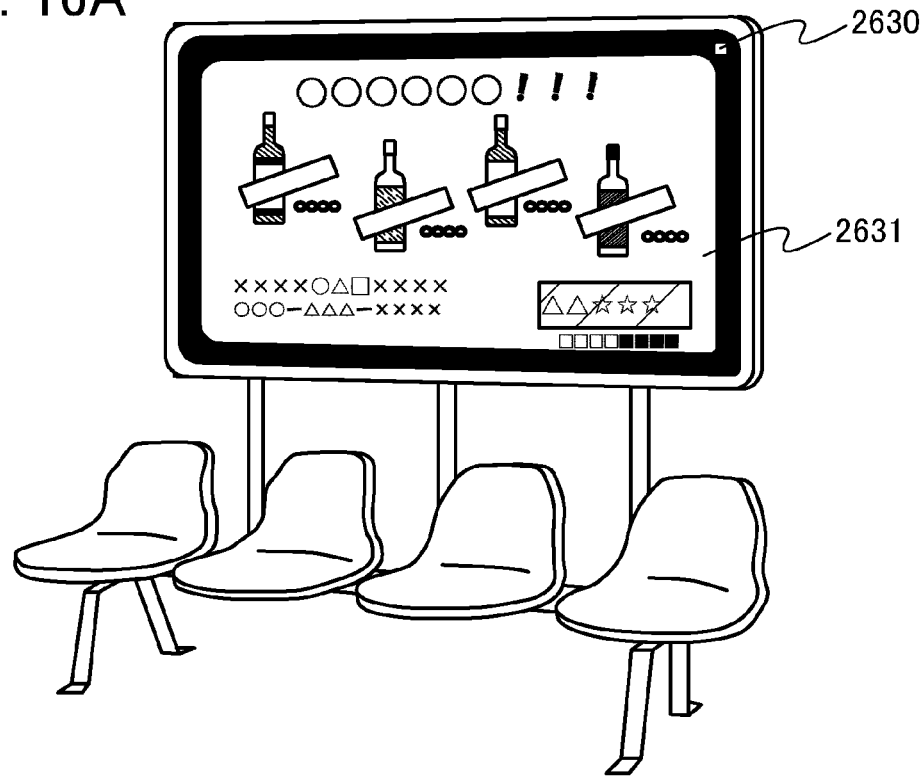
FIGS. 16A and 16B illustrate examples of a usage mode of electronic paper.

FIG. 16A illustrates a poster 2631 formed using electronic paper provided with a photosensor 2630 according to an embodiment of the present invention. In the case where an advertising medium is printed paper, the advertisement is replaced by manpower; however, by using electronic paper, the advertising display can be changed in a short time. Further, an image can be stably displayed without display deterioration. Since the photosensor 2630 is provided, the display state can be changed depending on the illuminance of external light. Note that the poster may have a configuration capable of wirelessly transmitting and receiving data.

Figure 16B:
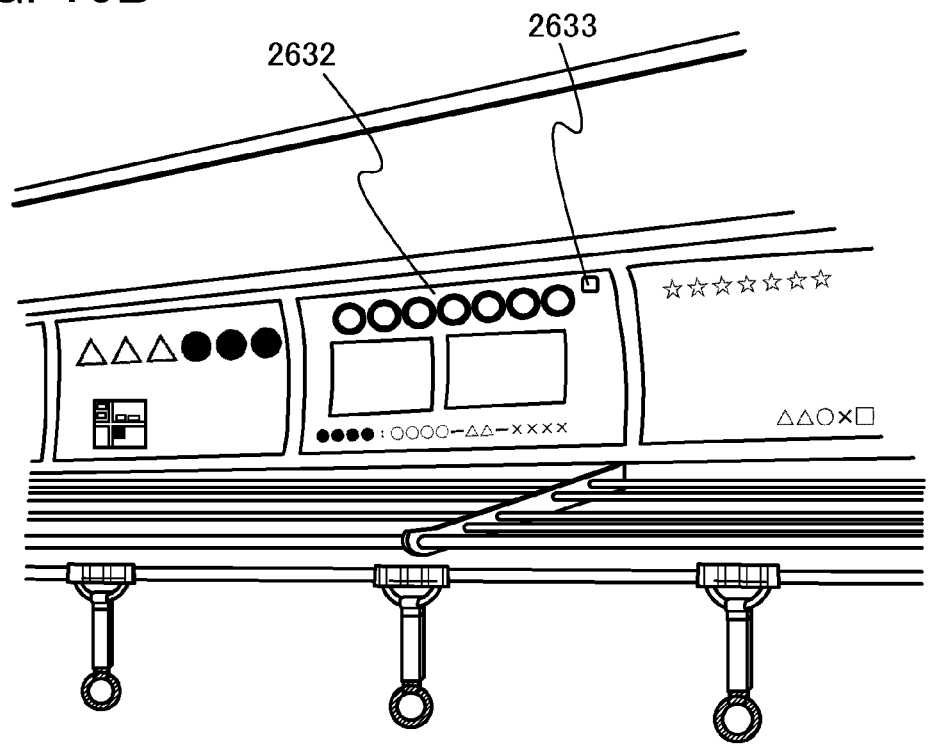

FIG. 16B illustrates an advertisement 2632 provided with a photosensor 2633 according to an embodiment of the present invention, in a vehicle such as a train. In the case where an advertising medium is printed paper, the advertisement is replaced by manpower; however, by using electronic paper, the advertising display can be changed in a short time without a lot of manpower. Further an image can be stably displayed without display deterioration. Since the photosensor 2633 is provided, the display state can be changed depending on the illuminance of external light. Note that the advertisement in a vehicle may have a configuration capable of wirelessly transmitting and receiving data.

Figure 17:
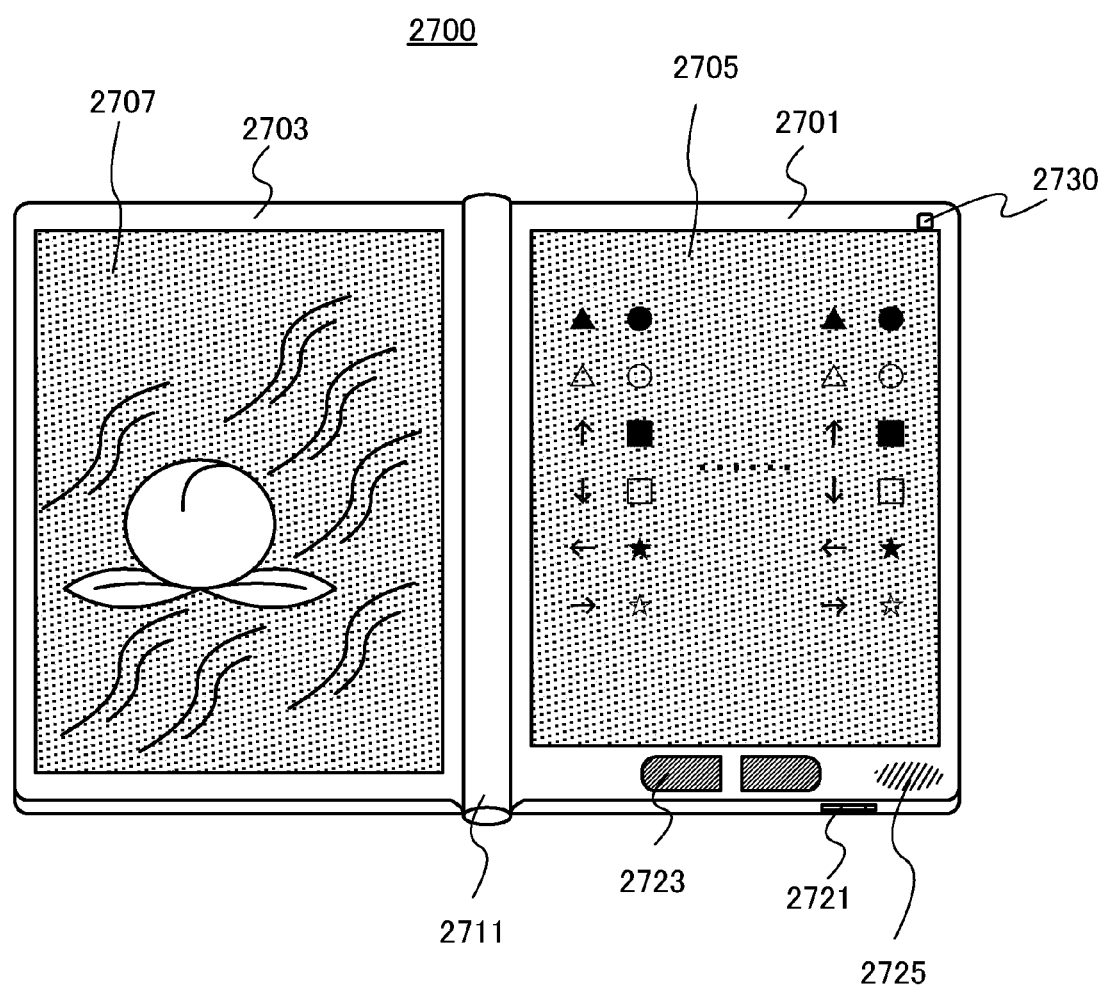
FIG. 17 is an external view of an example of an electronic book reader.

FIG. 17 illustrates an example of an electronic book reader provided with a photosensor 2730 according to an embodiment of the present invention. For example, an electronic book reader 2700 includes two housings, a housing 2701 and a housing 2703. The housing 2701 and the housing 2703 are combined with a hinge 2711 so that the electronic book reader 2700 can be opened and closed using the hinge 2711 as an axis. With such a structure, the electronic book reader 2700 can be operated like a paper book. Since the photosensor 2730 is provided, the display can be automatically turned on or off in response to the opening and closing operation of the electronic book reader 2700, for example.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 17) can display text and a display portion on the left side (the display portion 2707 in FIG. 17) can display graphics.

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book reader 2700 may have a function of an electronic dictionary.

The electronic book reader 2700 may have a configuration capable of wirelessly transmitting and receiving data. A structure may be employed in which a desired book data or the like is purchased and downloaded from an electronic book server wirelessly.

This embodiment can be implemented in combination with any of the other embodiments, as appropriate.

(Embodiment 9)

A photosensor according to an embodiment of the present invention can be mounted on a variety of electronic devices (including game machines). Examples of such electronic devices are a television device (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio playback device, a large-sized game machine such as a pinball machine, and the like.

Figure 18A:
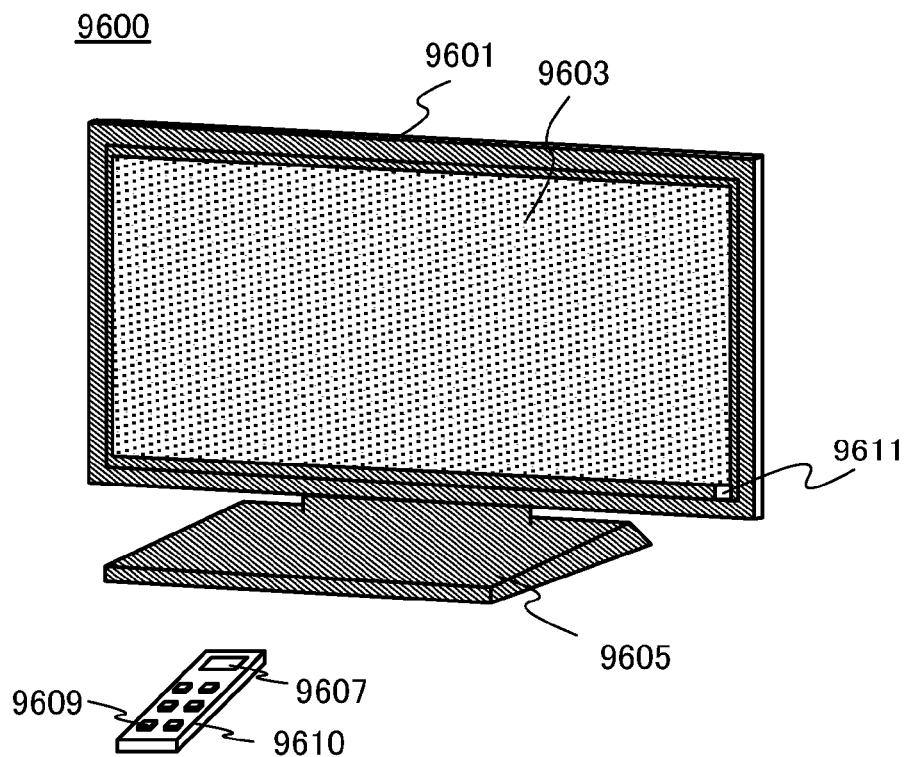
FIGS. 18A and 18B are external views illustrating an example of a television device and an example of a digital photo frame.

FIG. 18A illustrates an example of a television device provided with a photosensor 9611 according to an embodiment of the present invention. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels can be switched and the volume can be controlled with operation keys 9609 of the remote controller 9610, whereby an image displayed on the display portion 9603 can be controlled. Moreover, the remote controller 9610 may be provided with a display portion 9607 for displaying data output from the remote controller 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 18B:
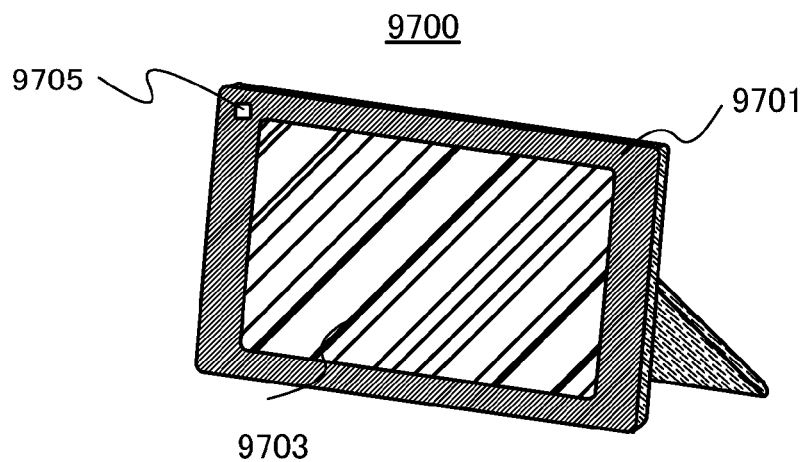

FIG. 18B illustrates an example of a digital photo frame provided with a photosensor 9705 according to an embodiment of the present invention. For example, in a digital photo frame 9700, a display portion 9703 is incorporated in a housing 9701. The display portion 9703 can display a variety of images. For example, the display portion 9703 can display image data taken with a digital camera or the like and function as a normal photo frame.

Note that the digital photo frame 9700 is provided with an operation portion, an external connection terminal (a USB terminal, a terminal connectable to a variety of cables such as a USB cable), a recording medium insertion portion, and the like. Although these components may be provided on the same surface as the display portion, it is preferable to provide them on the side surface or the back surface for design aesthetics. For example, a memory that stores image data taken with a digital camera is inserted into the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 19A:
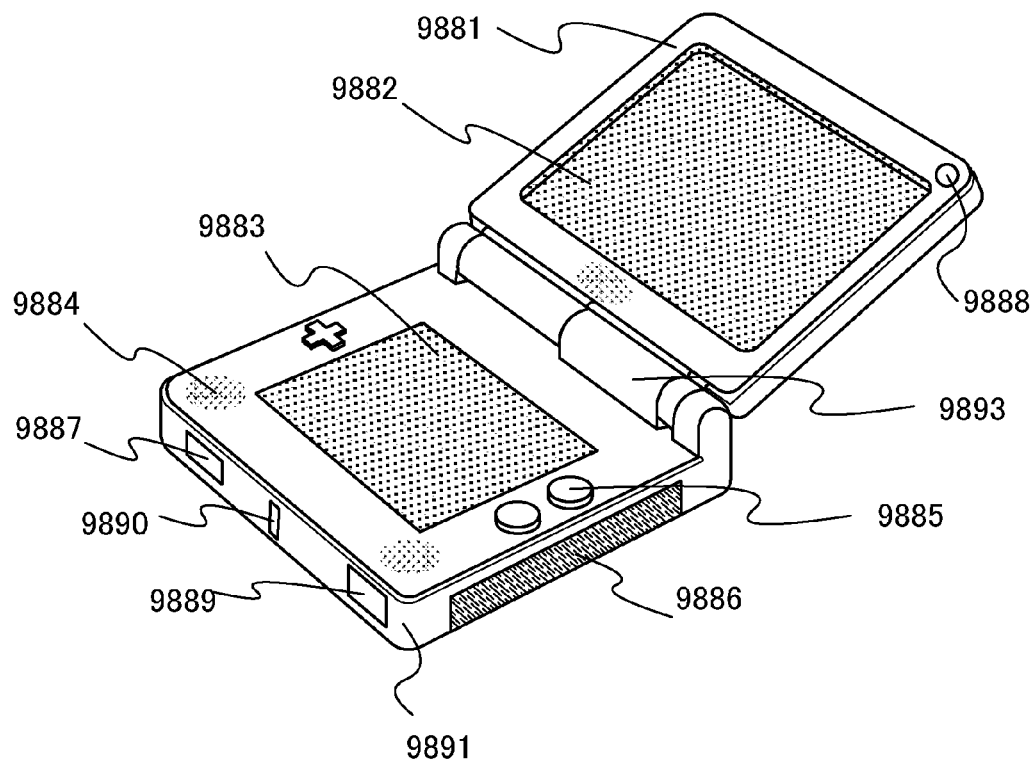
FIGS. 19A and 19B are external views each illustrating an example of an amusement machine.

FIG. 19A illustrates a portable game console including a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 19A is provided with a speaker portion 9884, a recording medium insertion portion 9886, an LED lamp 9890, input means (operation keys 9885, a connection terminal 9887, a sensor 9888 (one having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and another structure which is provided with at least a semiconductor device can be employed. The portable game console may include an additional accessory as appropriate. The portable game console illustrated in FIG. 19A has a function of reading a program or data stored in a recording medium to display it on the display portion, and a function of sharing data with another portable game console via wireless communication. Note that a function of the portable game console illustrated in FIG. 19A is not limited to those described above, and the portable game console can have a variety of functions.

Figure 19B:
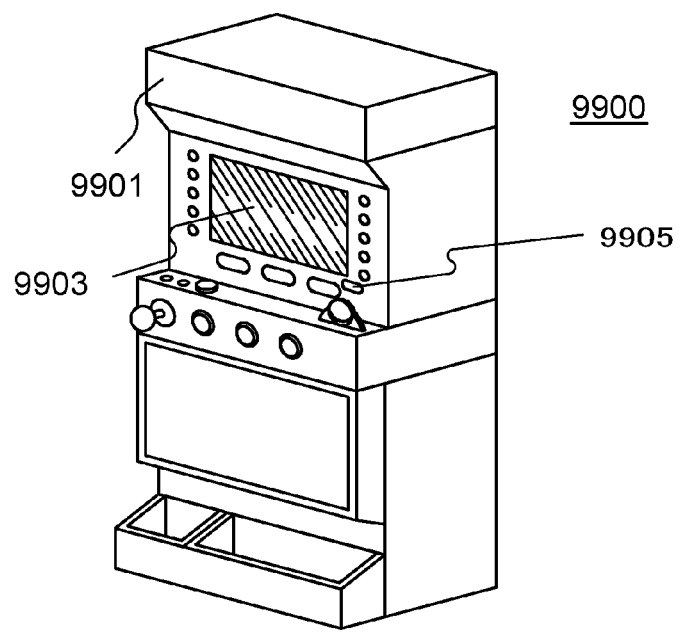

FIG. 19B illustrates an example of a slot machine which is a large-sized game machine provided with a photosensor 9905 according to an embodiment of the present invention. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and another structure which is provided with at least a semiconductor device may be employed. The slot machine 9900 may include an additional accessory as appropriate.

Figure 20A:
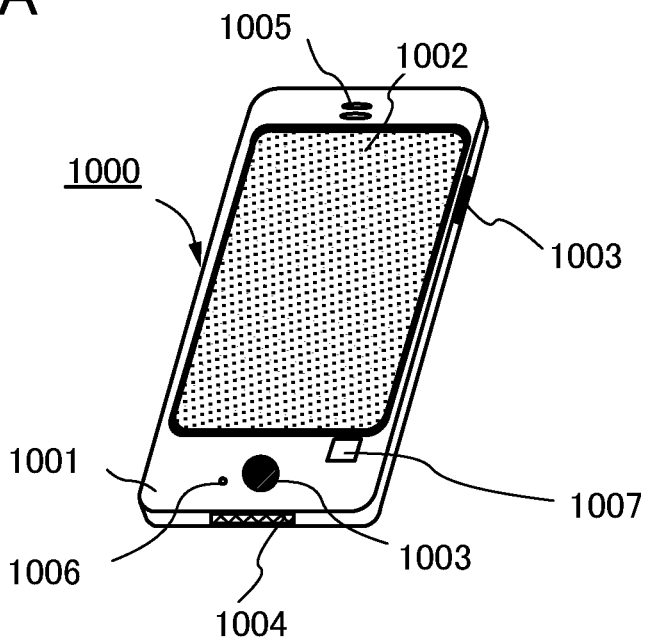
FIGS. 20A and 20B are external views each illustrating an example of a mobile phone.

FIG. 20A illustrates an example of a mobile phone provided with a photosensor 1007 according to an embodiment of the present invention. A mobile phone 1000 includes a housing 1001 in which a display portion 1002 is incorporated, an operation button 1003, an external connection port 1004, a speaker 1005, a microphone 1006, and the like.

Information can be input to the mobile phone 1000 illustrated in FIG. 20A by touching the display portion 1002 with a finger or the like. Moreover, users can make a call or compose a mail by touching the display portion 1002 with their fingers or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are combined.

For example, in the case of making a call or composing a mail, the display portion 1002 may be placed into a text input mode mainly for inputting text, and characters displayed on a screen can be input. In this case, it is preferable to display a keyboard or number buttons on almost the entire area of the screen of the display portion 1002.

When a detection device including a sensor which detects inclination, such as a gyroscope or an acceleration sensor, is provided inside the mobile phone 1000, display on the screen of the display portion 1002 can be automatically switched by detecting the direction of the mobile phone 1000 (whether the mobile phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on the kinds of image displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by a photosensor incorporated in the display portion 1002 and if input by touching the display portion 1002 is not performed for a certain period, the screen mode may be controlled so as to be switched from the input mode to the display mode. As the photosensor, any of the photosensors described in the above embodiments can be used.

The display portion 1002 can also function as an image sensor. For example, an image of a palm print, a fingerprint, or the like is taken when the display portion 1002 is touched with the palm or the finger, whereby personal authentication can be performed. Moreover, when a backlight or a sensing light source which emits near-infrared light is provided in the display portion, an image of finger veins, palm veins, or the like can be taken.

Figure 20B:
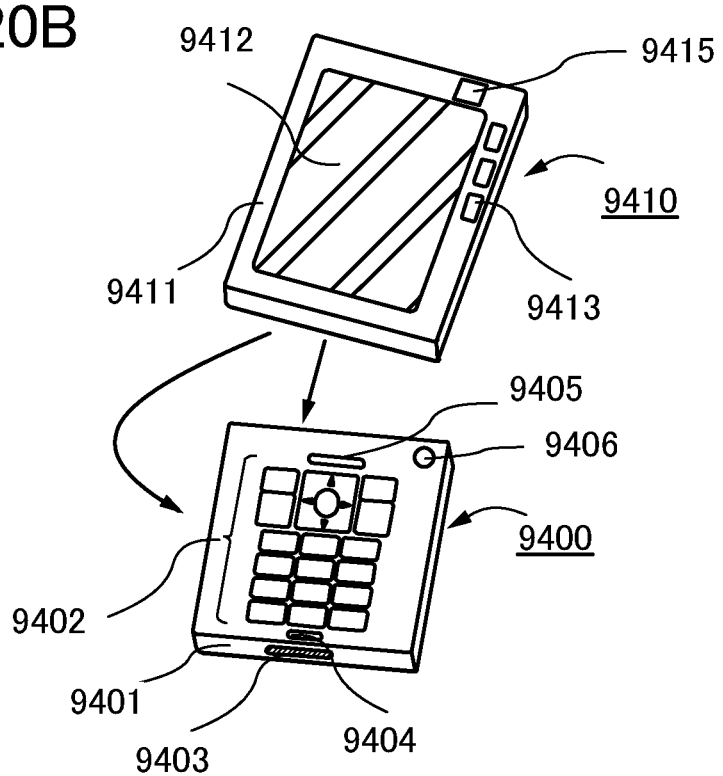

FIG. 20B illustrates another example of a mobile phone provided with a photosensor 9415 according to an embodiment of the present invention. The mobile phone in FIG. 20B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 having a display function can be detachably attached to the communication device 9400 having a phone function in two directions represented by the arrows. Thus, the display device 9410 and the communication device 9400 can be attached to each other along their short sides or long sides. In addition, when only the display function is needed, the display device 9410 can be detached from the communication device 9400 and used alone.

Images or input information can be transmitted or received by wireless or wire communication between the communication device 9400 and the display device 9410, each of which has a rechargeable battery.

Since the photosensor according to an embodiment of the present invention is provided in each of the above-described devices, the state of the display portion can be automatically changed in response to a change of external light or the opening and closing operation of the device. This embodiment can be implemented in combination with any of the other embodiments, as appropriate.

This application is based on Japanese Patent Application serial no. 2010-138916 filed with Japan Patent Office on Jun. 18, 2010, the entire contents of which are hereby incorporated by reference.

What is claimed is:

1. A sensor comprising:
   a transistor including a channel including an oxide semiconductor; and
   an oscillator circuit,
   wherein an output of the oscillator circuit is electrically connected to a gate electrode of the transistor,
   wherein the channel is a receiving portion, and
   wherein the oscillator circuit includes a light blocking layer.

2. A semiconductor device comprising:
   the sensor according to claim 1; and
   an RFID device that operates using a second transistor including a channel including the same material as the channel of the transistor included in the sensor,
   wherein the channel of the second transistor forms over the light blocking layer.

3. A semiconductor device comprising:
   the sensor according to claim 1; and
   a display device that operates using a second transistor including a channel including the same material as the channel of the transistor included in the sensor,
   wherein the channel of the second transistor forms over the light blocking layer.

4. A semiconductor device comprising:
   the sensor according to claim 1; and
   electronic paper that operates using a second transistor including a channel including the same material as the channel of the transistor included in the sensor,
   wherein the channel of the second transistor forms over the light blocking layer.

5. A semiconductor device comprising:
   the sensor according to claim 1; and
   an RFID device that operates using a second transistor including a channel including the same material as the channel of the transistor included in the sensor,
   wherein a gate insulating layer of the second transistor forms over a source electrode and a drain electrode of the second transistor, and
   wherein a gate electrode of the second transistor forms over the channel of the second transistor.

6. A semiconductor device comprising:
   the sensor according to claim 1; and
   a display device that operates using a second transistor including a channel including the same material as the channel of the transistor included in the sensor,
   wherein a gate insulating layer of the second transistor forms over a source electrode and a drain electrode of the second transistor, and
   wherein a gate electrode of the second transistor forms over the channel of the second transistor.

7. A semiconductor device comprising:
   the sensor according to claim 1; and
   electronic paper that operates using a second transistor including a channel including the same material as the channel of the transistor included in the sensor,
   wherein a gate insulating layer of the second transistor forms over a source electrode and a drain electrode of the second transistor, and
   wherein a gate electrode of the second transistor forms over the channel of the second transistor.

8. The sensor according to claim 1, wherein the sensor measures force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray.

* * * * *